United States Patent
Nishio

(10) Patent No.: US 10,839,119 B2
(45) Date of Patent: Nov. 17, 2020

(54) BUS WIRING SEARCHING METHOD AND INFORMATION PROCESSING APPARATUS

(71) Applicant: FUJITSU LIMITED, Kawasaki (JP)

(72) Inventor: Yoshitaka Nishio, Yokosuka (JP)

(73) Assignee: FUJITSU LIMITED, Kawasaki (JP)

( * ) Notice: Subject to any disclaimer, the term of this patent is extended or adjusted under 35 U.S.C. 154(b) by 157 days.

(21) Appl. No.: 16/262,038

(22) Filed: Jan. 30, 2019

(65) Prior Publication Data
US 2019/0258751 A1    Aug. 22, 2019

(30) Foreign Application Priority Data
Feb. 16, 2018    (JP) .................. 2018-026505

(51) Int. Cl.
G06F 30/30    (2020.01)
G06F 30/327    (2020.01)

(52) U.S. Cl.
CPC ................. *G06F 30/327* (2020.01)

(58) Field of Classification Search
CPC ..... G06F 30/394; G06F 30/398; G06F 30/392
USPC .......................................... 716/103
See application file for complete search history.

(56) References Cited

U.S. PATENT DOCUMENTS

| 2003/0014725 A1 | 1/2003 | Sato et al. |
| 2009/0300568 A1 * | 12/2009 | Kuroda ................... G06F 30/30 716/122 |
| 2010/0030358 A1 | 2/2010 | Tsubamoto et al. |

FOREIGN PATENT DOCUMENTS

| JP | 2003-091568 | 3/2003 |
| WO | 2008/146356 | 12/2008 |

* cited by examiner

*Primary Examiner* — Jack Chiang
*Assistant Examiner* — Brandon Bowers
(74) *Attorney, Agent, or Firm* — Fujitsu Patent Center

(57) ABSTRACT

An information processing apparatus includes a processor that generates a first node when a bus wiring condition is changed from a first condition to a second condition or when a result of bus wiring is generated based on the first condition. The processor stores the first condition and design data of bus wiring after the change in a storage unit in association with the first node when the bus wiring condition is changed. The processor stores the result of bus wiring, and the design data of bus wiring after the generation in the storage unit in association with the first node when the result of bus wiring is generated, the first condition. The processor searches, upon receiving a designation of a bus wiring condition, for a second node that matches the designated bus wiring condition. The processor outputs design data of bus wiring corresponding to the second node.

10 Claims, 29 Drawing Sheets

FIG. 17

| COMPARISON RESULT | | | | | | | | CSV OUTPUT ☒ |
|---|---|---|---|---|---|---|---|---|
| NODE ID | XXXX | | | | YYYY | | | |
| BUS NET DIVISION CONDITION | BUS NAME | NET NAME | FROM PIN NAME | TO PIN NAME | BUS NAME | NET NAME | FROM PIN NAME | TO PIN NAME |
|  | BUS1 | NET A | P1.3 | P5.7 | BUS1 | - | | |
|  | - | | | | | NETB | P1.2 | P5.5 |
| BUS DIVISION WIRING LAYER | BUS NAME | WIRING LAYER | | | BUS NAME | WIRING LAYER | | |
|  | BUS1 | L3 | | | BUS1 | L5 | | |
|  | BUS2 | L5 | | | BUS2 | L7 | | |
|  | BUS3 | L7 | | | BUS3 | L3 | | |
| BUS DIVISION WIRING ROUTE | BUS NAME | ROUTE COORDINATE | | | BUS NAME | ROUTE COORDINATE | | |
|  | BUS1 | (100,120) | | | BUS1 | - | | |
|  |  | (100,150) | | | | - | | |
|  |  | (120,180) | | | | - | | |
|  |  | (200,180) | | | | - | | |
|  |  | - | | | | (100,115) | | |
|  |  | - | | | | (170,120) | | |
|  |  | - | | | | (200,150) | | |
|  |  | - | | | | (195,180) | | |
| NET WIRING WIDTH | NET NAME | LAYER NAME | LINE WIDTH | | NET NAME | LAYER NAME | LINE WIDTH | |
| BUS WIRING ORDER | BUS NAME | WIRING ORDER | | | BUS NAME | WIRING ORDER | | |
| WIRING RESULT | WIRING LAYER | NET NAME | COORDINATE | AFFILIATED BUS NAME | WIRING LAYER | NET NAME | COORDINATE | AFFILIATED BUS NAME |
|  | L3 | NET-X | (30,80) | - | | | | |
|  | ... | | | | | | | |

BUS WIRING SEARCHING METHOD AND INFORMATION PROCESSING APPARATUS

CROSS-REFERENCE TO RELATED APPLICATION

This application is based upon and claims the benefit of priority of the prior Japanese Patent Application No. 2018-026505, filed on Feb. 16, 2018, the entire contents of which are incorporated herein by reference.

FIELD

The embodiments discussed herein are related to a bus wiring searching method and an information processing apparatus.

BACKGROUND

In recent years, it has been common in a wiring design work in a multilayer board that design constraint conditions are instructed because of increased signal speed. For example, in a case of wiring with plural layers using vias, since a delay occurs due to an interlayer movement, wiring that uses a lead-out via from a parts pin but does not use vias in the middle of the wiring (hereinafter, referred to as single layer wiring) may be instructed as constraint conditions. However, when a signal group having a large number of signals (hereinafter, referred to as a bus) is wired in a single layer, since a wiring region expands due to, for example, detouring and a line length difference between signals becomes larger, it becomes difficult to make an adjustment in order to comply with the equal length conditions, which may hinder a high-density wiring. In the meantime, a line length difference is suppressed by dividing a bus into plural layers and wiring a signal group divided by each layer in a single layer. In the automatic wiring of the wiring design work, it has been proposed to provide priority to the design condition and change the design conditions according to the priority.

Related techniques are disclosed in, for example, International Publication Pamphlet No. WO 2008/146356, and Japanese Laid-open Patent Publication No. 2003-091568.

SUMMARY

According to an aspect of the present invention, provided is an information processing apparatus including a memory and a processor coupled to the memory. The processor is configured to generate a first node when a bus wiring condition is changed from a first wiring condition to a second wiring condition or when a result of bus wiring is generated based on the first wiring condition. The processor is configured to store the first wiring condition and design data of bus wiring after the change of the bus wiring condition in a storage unit in association with the first node when the bus wiring condition is changed from the first wiring condition to the second wiring condition. The processor is configured to store the first wiring condition, the result of bus wiring, and the design data of bus wiring after the result of bus wiring is generated in the storage unit in association with the first node when the result of bus wiring is generated based on the first wiring condition. The processor is configured to search, upon receiving a designation of a bus wiring condition, for a second node that matches the designated bus wiring condition. The processor is configured to output design data of bus wiring corresponding to the second node.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 17 is a view illustrating an example of a result of comparison between two nodes.

DESCRIPTION OF EMBODIMENTS

In the single layer wiring of the bus, when the wiring is executed by setting the bus wiring conditions such as the division conditions, the wiring layer conditions, the wiring route condition, and the wiring rule, in a case where all the target nets are not wired, a reworking is performed to change any one of the conditions. In this case, a determination whether to change the bus wiring conditions which is not satisfied or whether to rearrange other wirings that affect the bus wiring may not be made even by a skilled designer unless the skilled designer actually performs reworking. Since the design data at the stage where the designer wants to rework saves the design data at the stage where the designer considers necessary, it is difficult to manage how the bus wiring conditions are changed. Therefore, it is difficult to obtain design data at an arbitrary stage.

Hereinafter, embodiments will be described in detail with reference to the accompanying drawings. The disclosed techniques are not limited by these embodiments.

Embodiments

Figure 1A:
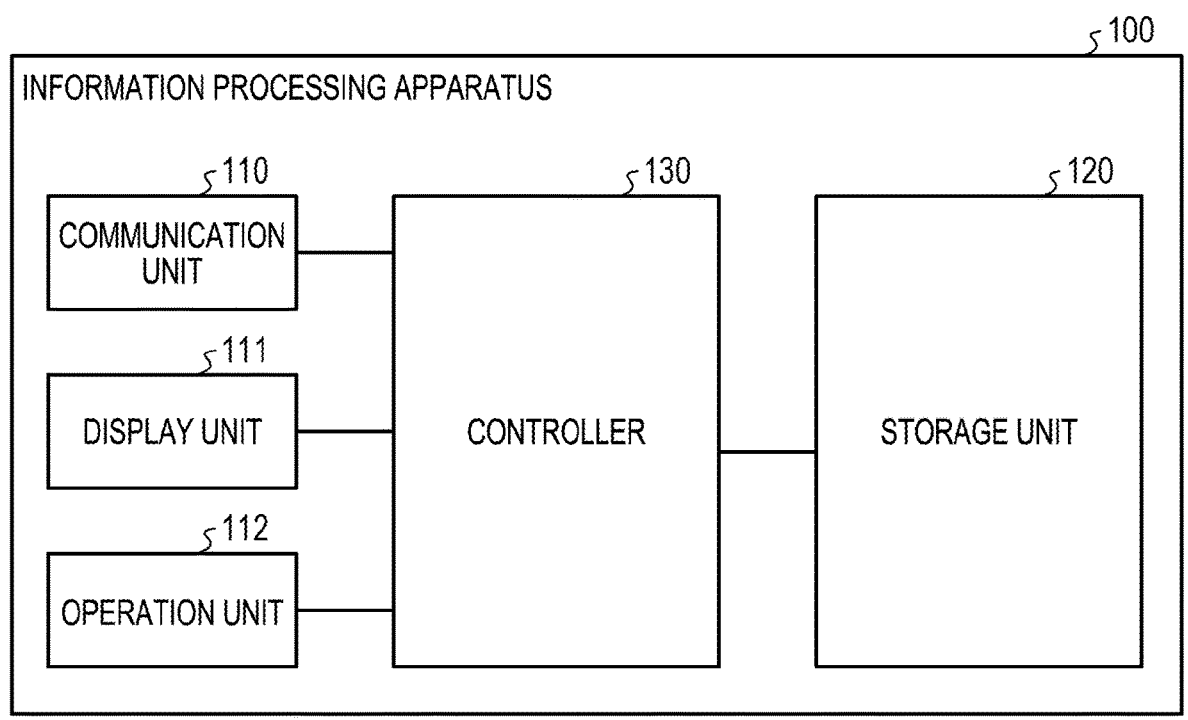
FIG. 1A is a block diagram illustrating an example of the configuration of an information processing apparatus according to an embodiment.

FIG. 1A is a block diagram illustrating an example of the configuration of an information processing apparatus according to an embodiment. The information processing apparatus 100 illustrated in FIG. 1A is an example of an information processing apparatus that performs design support by managing design data in a CAD (Computer Aided Design) for designing a printed wiring board. The information processing apparatus 100 generates a first node when changing the conditions of bus wiring or generating a result of the wiring based on the bus wiring conditions. The information processing apparatus 100 associates the bus wiring conditions and the design data of the changed bus wiring conditions with the generated first node, or associates the bus wiring conditions, the wiring result, and the design data of the generated wiring result with the generated first node. The information processing apparatus 100 then stores the association in a storage unit. Upon receiving a designation of the bus wiring conditions, the information processing apparatus 100 searches for a second node that matches the designated bus wiring conditions. The information processing apparatus 100 outputs the design data corresponding to the searched second node. As a result, the information processing apparatus 100 may obtain design data at an arbitrary stage.

Figure 1B:
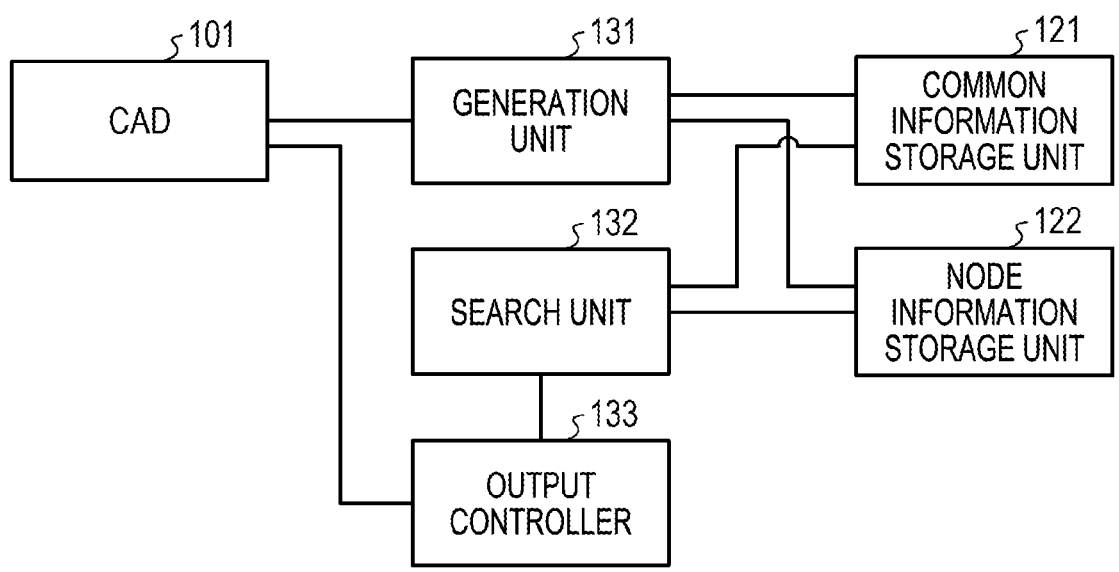
FIG. 1B is a block diagram illustrating an example of a functional configuration of the information processing apparatus according to the embodiment.

Next, the configuration of the information processing apparatus 100 will be described. FIG. 1B is a block diagram illustrating an example of a functional configuration of the information processing apparatus according to the embodiment. As illustrated in FIG. 1A, the information processing apparatus 100 includes a communication unit 110, a display unit 111, an operation unit 112, a storage unit 120, and a controller 130. In addition to the functional units illustrated in FIGS. 1A and 1B, the information processing apparatus 100 may be configured to include various different functional units of a known computer, for example, functional units such as various input devices and audio output devices.

A CAD 101 is an example of CAD for designing a printed wiring board. When design data are stored, the CAD 101 transfers the design data to a generation unit 131 of the controller 130. Further, when the design data are transferred from an output controller 133 of the controller 130, the CAD 101 reads the design data and displays the read design data on a CAD design screen so as to display the design data to be editable by a designer.

The communication unit 110 is implemented by, for example, an NIC (Network Interface Card). The communication unit 110 is a communication interface that is connected to other information processing apparatuses by wired or wirelessly via a network (not illustrated) and is responsible for communication of information with other information processing apparatuses. The communication unit 110 receives design data from, for example, a server (not illustrated). In addition, the communication unit 110 transmits design data and management data to a server (not illustrated).

The display unit 111 is a display device that displays various types of information. The display unit 111 is implemented by, for example, a liquid crystal display as a display device. The display unit 111 displays various screens such as a display screen input from the controller 130.

The operation unit 112 is an input device that receives various operations from a user of the information processing apparatus 100. The operation unit 112 is implemented by, for example, a keyboard or a mouse as an input device. The operation unit 112 outputs an operation input by the user to the controller 130 as operation information. The operation unit 112 may be configured to be implemented by a touch panel as an input device, and the display device of the display unit 111 and the input device of the operation unit 112 may be configured to be integrated.

The storage unit 120 is implemented by, for example, a semiconductor memory element such as a RAM (Random Access Memory) or a flash memory, or a storage device such as a hard disk or an optical disk. The storage unit 120 includes a common information storage unit 121 and a node information storage unit 122. Further, the storage unit 120 stores information used for processing in the controller 130.

Figure 2:
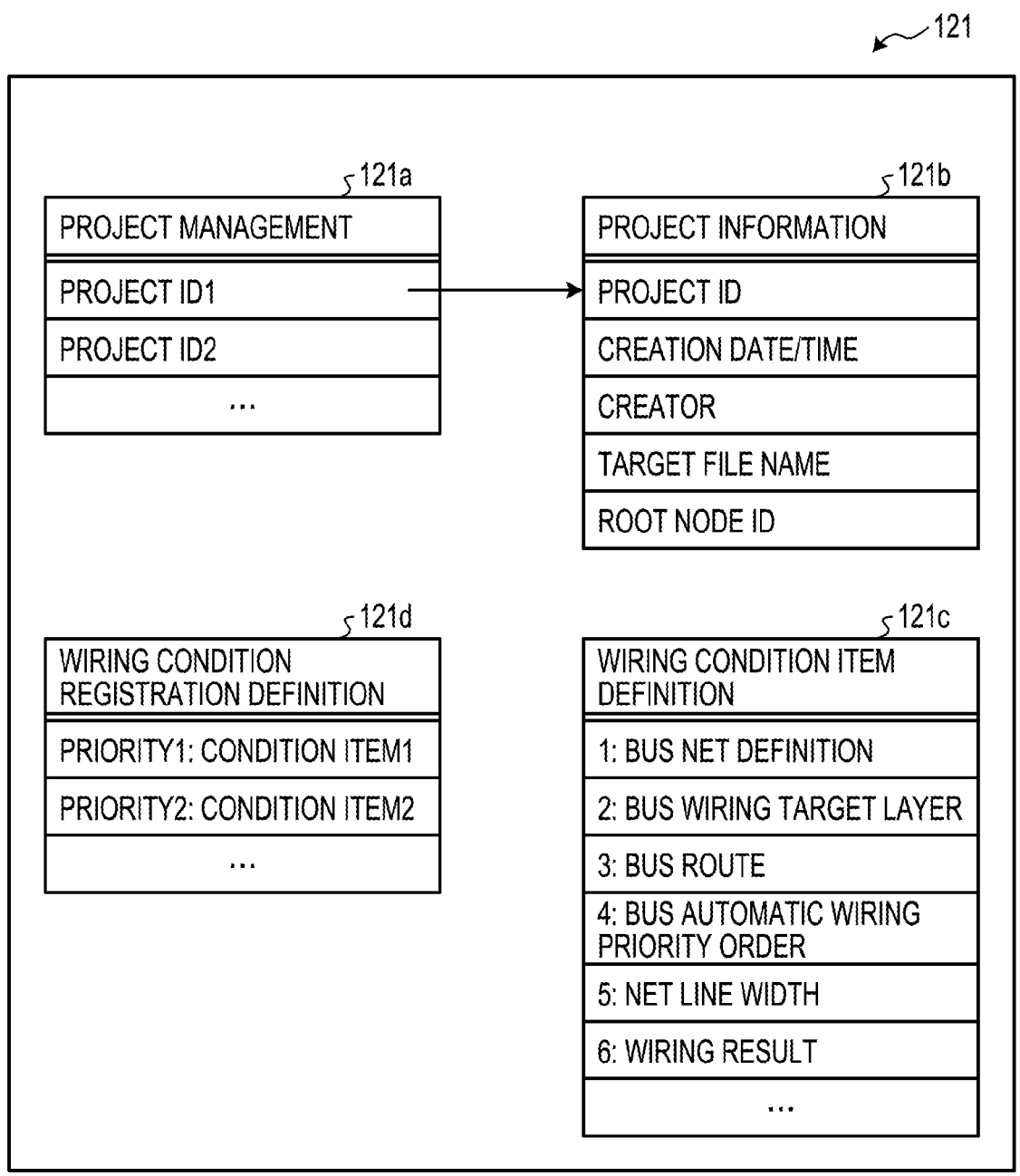
FIG. 2 is a view illustrating an example of a common information storage unit.

The common information storage unit 121 stores common information that manages the entire design data of the CAD 101. FIG. 2 is a view illustrating an example of the common information storage unit. As illustrated in FIG. 2, the common information storage unit 121 includes items such as project management 121*a*, project information 121*b*, wiring condition item definition 121*c*, and wiring condition registration definition 121*d*.

The project management 121*a* stores a project ID (Identifier). The project ID is an identifier that identifies a project. The project ID is, for example, an ID assigned to each printed wiring board to be designed.

The project information 121*b* stores information on the project identified by the project ID. The project information 121*b* includes items such as "project ID", "creation date/time", "creator", "target file name", and "root node ID".

The "project ID" is an identifier that identifies a project. The "creation date/time" is information indicating the date/time when the project is created. The "creation date/time" may be updated with the date/time when the design data is updated. The "creator" is information indicating a user who creates the project. The "target file name" is information indicating a file name of the design data. The "root node ID" is information indicating a node ID of a root node (hereinafter also referred to as a reference node) as a reference when representing the history of design data by a tree structure.

The wiring condition item definition 121*c* stores items to be treated as wiring conditions. The wiring condition item definition 121*c* includes items such as "1: bus net definition", "2: bus wiring target layer", "3: bus route", "4: bus automatic wiring priority order", "5: net line width", and "6: wiring result". The head number of each item indicates the number of the condition item.

The item "1: bus net definition" corresponds to information indicating how the bus wiring is divided. The item "2: bus wiring target layer" corresponds to information indicating a layer on which the bus wiring is performed. The item "3: bus route" corresponds to information indicating a route of the bus. The item "4: bus automatic wiring priority order" corresponds to information indicating a priority order in bus automatic wiring. The item "5: net line width" corresponds to information indicating the line width of a net, that is, the width of the wiring. The item "6: wiring result" corresponds to information indicating the wiring result of the automatic wiring.

The wiring condition registration definition 121d stores the priority of each wiring condition item of the wiring condition item definition 121c. For example, "priority 1: condition item 1" in the wiring condition registration definition 121d indicates that the condition item number 1 in the wiring condition item definition 121c indicates is the priority "1".

Figure 3:
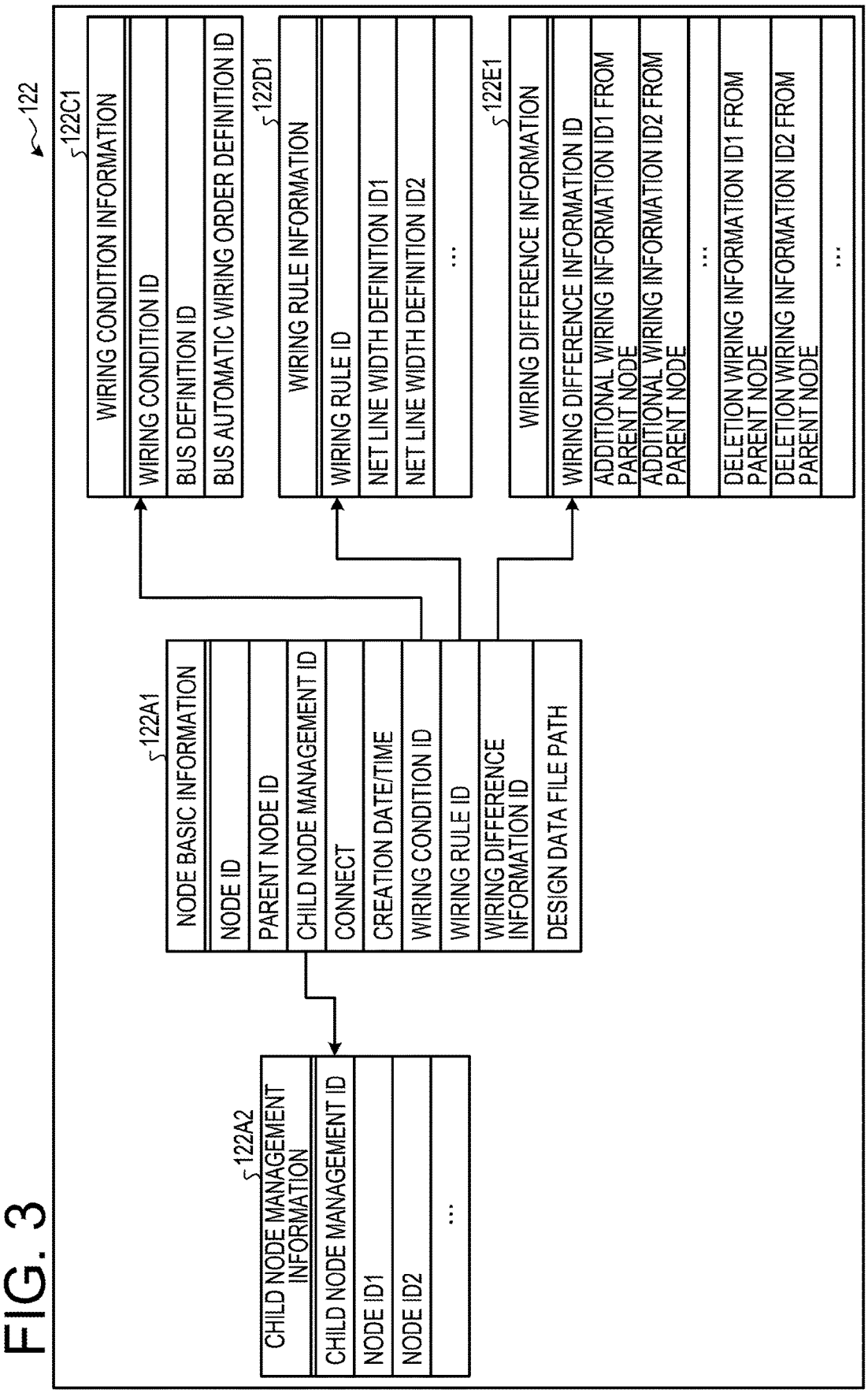
FIG. 3 is a view illustrating an example of a node information storage unit.

Referring back to FIGS. 1A and 1B, the node information storage unit 122 stores information of each node when the history of design data is represented by a tree structure. FIG. 3 is a view illustrating an example of the node information storage unit. As illustrated in FIG. 3, the node information storage unit 122 has node basic information 122A1 for each node. The node basic information 122A1 includes items such as "node ID", "parent node ID", "child node management ID", "comment", "creation date/time", "wiring condition ID", "wiring rule ID", "wiring difference information ID", and "design data file path". In addition, the node basic information 122A1 includes child node management information 122A2, wiring condition information 122C1, wiring rule information 122D1, and wiring difference information 122E1, as information linked to the items. That is, the node basic information 122A1 is information including the bus wiring condition, the wiring result, and the file path of the design data. In addition, the node basic information 122A1 may be configured to include the design data itself instead of the file path of the design data.

The item "node ID" is an identifier that identifies a node. The item "parent node ID" is information indicating the ID of a parent node. The item "child node management ID" is an identifier that identifies the child node management information 122A2 which manages a child node of the relevant node. The item "comment" is information indicating a comment on the relevant node. The item "creation date/time" is information indicating the date/time when the relevant node is created. The item "wiring condition ID" is an identifier that identifies the wiring condition information 122C1 which manages the wiring condition of the relevant node. The item "wiring rule ID" is an identifier that identifies the wiring rule information 122D1 which manages the wiring rule of the relevant node. The item "wiring difference information ID" is an identifier that identifies the wiring difference information 122E1 which manages the wiring difference of the relevant node. The item "design data file path" is information indicating a file path that stores design data of the relevant node.

The child node management information 122A2 includes items such as "child node management ID", "node ID1", and "node ID2". The item "child node management ID" is an identifier that identifies the child node management information 122A2. The items "node ID1" and "node ID2" are information indicating the ID of a child node at the node of the node basic information 122A1 linked with the child node management ID.

The wiring condition information 122C1 includes items such as "wiring condition ID", "bus definition ID", and "bus automatic wiring order definition ID". The item "wiring condition ID" is an identifier that identifies the wiring condition information 122C1. The item "bus definition ID" is an identifier that identifies the bus definition in the node of the node basic information 122A1 linked with the wiring condition ID. The item "bus automatic wiring order definition ID" is an identifier that identifies the bus automatic wiring order definition at the node of the node basic information 122A1 linked with the wiring condition ID.

The wiring rule information 122D1 includes items such as "wiring rule ID", "net line width definition ID1", and "net line width definition ID2". The item "wiring rule ID" is an identifier that identifies the wiring rule information 122D1. The items "net line width definition ID1" and "net line width definition ID2" are identifiers that identify the net line width definition at the node of the node basic information 122A1 linked with the wiring rule ID. The tailing number distinguishes plural net line width definition IDs. Hereinafter, similarly, a trailing number of each ID distinguishes plural items.

The wiring difference information 122E1 includes items such as "wiring difference information ID", "additional wiring information ID1 from parent node", "additional wiring information ID2 from parent node", "deletion wiring information ID1 from parent node", and "deletion wiring information ID2 from parent node". The item "wiring difference information ID" is an identifier that identifies the wiring difference information 122E1. The items "additional wiring information ID1 from parent node" and "additional wiring information ID2 from parent node" are identifiers that identify wiring information added to the parent node as a result of the automatic wiring at the node of the node basic information 122A1 linked with the wiring difference information ID. The items "deletion wiring information ID1 from parent node" and "deletion wiring information ID2 from parent node" are identifiers that identify wiring information deleted from the parent node as a result of the automatic wiring at the node of the node basic information 122A1 linked with the wiring difference information ID.

Figure 4:
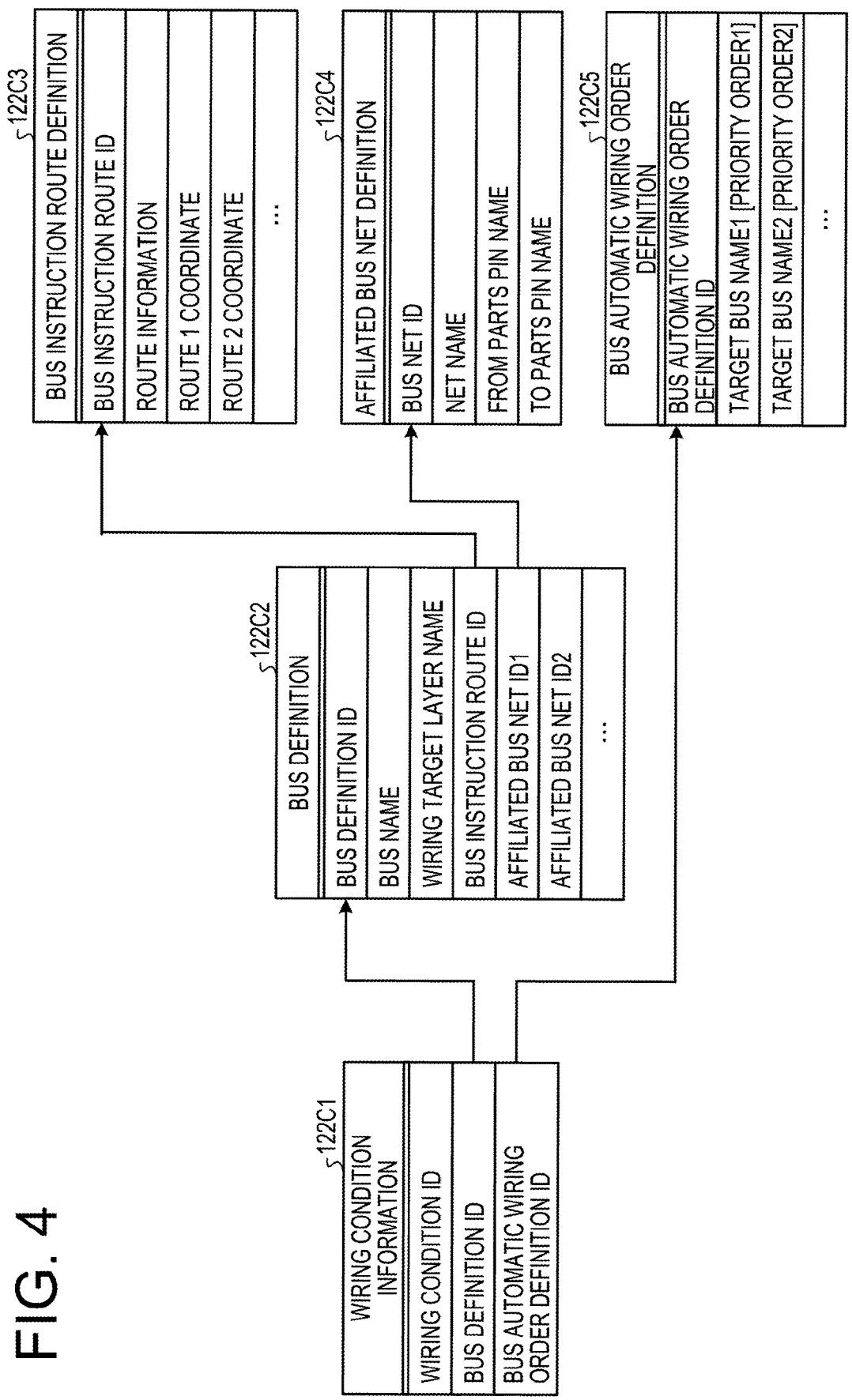
FIG. 4 is a view illustrating an example of a data structure of wiring condition information.

Next, with reference to FIGS. 4 to 6, descriptions will be made on data structures under the wiring condition information 122C1, the wiring rule information 122D1, and the wiring difference information 122E1. FIG. 4 is a view illustrating an example of the data structure of the wiring condition information. As illustrated in FIG. 4, the item "bus definition ID" of the wiring condition information 122C1 is an identifier that identifies the bus definition 122C2 under the wiring condition information 122C1. The item "bus automatic wiring order definition ID" of the wiring condition information 122C1 is an identifier that identifies the bus automatic wiring order definition 122C5 under the wiring condition information 122C1.

The bus definition 122C2 includes items such as "bus definition ID", "bus name", "wiring target layer name", "bus instruction route ID", "affiliated bus net ID1", and "affiliated bus net ID2". The item "bus definition ID" is an identifier that identifies the bus definition 122C2. The item "bus name" is information indicating the name of a bus. The item "wiring target layer name" is information indicating the name of a layer to which the relevant bus is wired. The item "bus instruction path ID" is an identifier that identifies the bus instruction path definition 122C3 indicating the path information of the relevant bus. The items "affiliated bus net ID1" and "affiliated bus net ID2" are identifiers that identify the affiliated bus net definition 122C4 indicating a bus net to which the relevant bus belongs.

The bus instruction route definition 122C3 includes items such as "bus instruction route ID", "route information", "route 1 coordinate", and "route 2 coordinate". The item "bus instruction route ID" is an identifier that identifies the bus instruction route definition 122C3. The item "route information" is information indicating a bus instruction route. The items "route 1 coordinate" and "route 2 coordinate" are located under the "route information" and are information indicating the coordinates of respective routes.

The affiliated bus net definition 122C4 includes items such as "bus net ID", "net name", "FROM parts pin name", and "TO parts pin name". The item "bus net ID" is an identifier that identifies the affiliated bus net definition 122C4. The item "net name" is information indicating the name of the relevant net, that is, the wiring. The items "FROM parts pin name" and "TO parts pin name" are information indicating the parts pin names connected respectively to both ends of the net. The items "FROM parts pin name" and "TO parts pin name" are acquired from a net list of the design data.

The bus automatic wiring order definition 122C5 includes items such as "bus automatic wiring order definition ID", "target bus name 1[priority order 1]", and "target bus name 2[priority order 2]". The item "bus automatic wiring order definition ID" is an identifier that identifies the bus automatic wiring order definition 122C5. The items "target bus name 1[priority order 1.]" and "target bus name 2[priority order 2]" are information indicating the target bus name and priority order of the automatic wiring.

Figure 5:
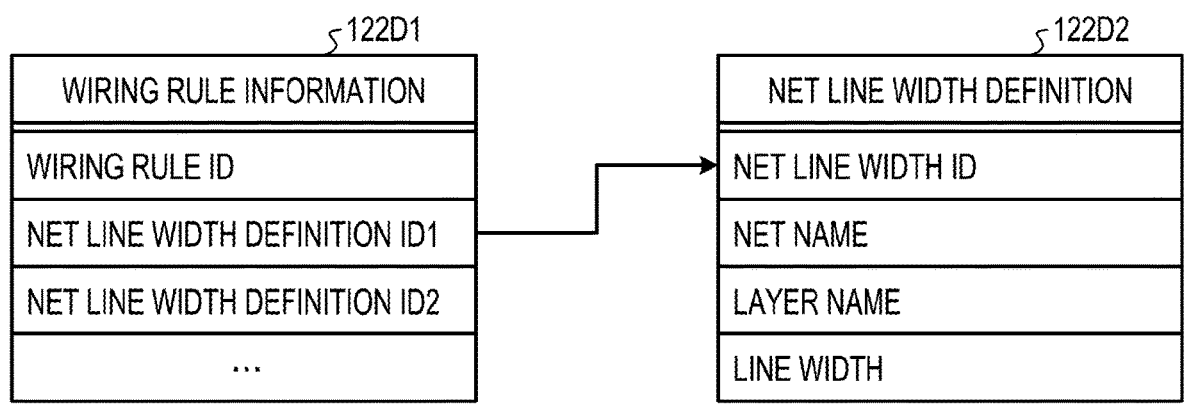
FIG. 5 is a view illustrating an example of a data structure of wiring rule information.

FIG. 5 is a view illustrating an example of the data structure of the wiring rule information. As illustrated in FIG. 5, the items "net line width definition ID1" and "net line width definition ID2" of the wiring rule information 122D1 are identifiers that identify the net line width definition 122D2 under the wiring rule information 122D1.

The net line width definition 122D2 includes items such as "net line width ID", "net name", "layer name", and "line width". The item "net line width ID" is an identifier that identifies the net line width definition 122D2. The item "net name" is information indicating the name of a net where the line width is defined. The item "layer name" is information indicating the name of a wiring layer to which a net is wired. The item "line width" is information indicating the line width of a net to be wired.

Figure 6:
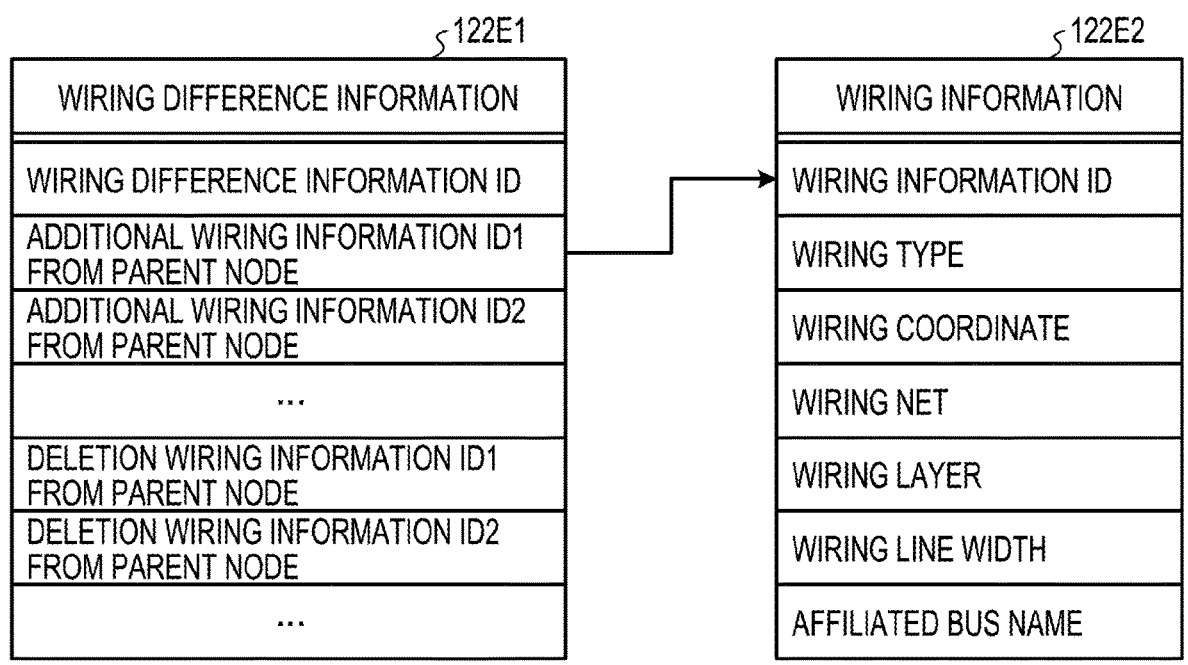
FIG. 6 is a view illustrating an example of a data structure of wiring difference information.

FIG. 6 is a view illustrating an example of the data structure of the wiring difference information. As illustrated in FIG. 6, the items "additional wiring information ID1 from parent node" and "additional wiring information ID2 from parent node" of the wiring difference information 122E1 are identifiers that identify the wiring information 122E2 under the wiring difference information 122E1. The items "deletion wiring information ID1 from parent node" and "deletion wiring information ID2 from parent node" are the same as in the addition from the parent node.

The wiring information 122E2 includes items such as "wiring information ID", "wiring type", "wiring coordinate", "wiring net", "wiring layer", "wiring line width", and "affiliated bus name". The item "wiring information ID" is an identifier that identifies the wiring information 122E2. The item "wiring type" is information indicating the type of wiring (net) added or deleted from the parent node. The item "wiring type" includes, for example, a line representing a straight line and a circular arc representing a curve. The item "wiring coordinate" is information indicating the coordinate of wiring (net). For example, when the item "wiring type" is a line, the item "wiring coordinate" indicates a FROM coordinate and a TO coordinate. When the item "wiring type" is a circular arc, the item "wiring coordinate" indicates coordinates of a center point, a starting point, and an end point. The item "wiring net" is information indicating the name of wiring, that is, the name of the net. The item "wiring layer" is information indicating a wiring layer that is wired.

The item "wiring line width" is information indicating the line width of wiring. The item "affiliated bus name" is information indicating the name of a bus to which the wiring belongs.

Referring back to FIGS. 1A and 1B, the controller 130 is implemented, for example, by a CPU (Central Processing Unit) or an MPU (Micro Processing Unit) that executes a program stored in an internal storage device with a RAM as a work area. Further, the controller 130 may be configured to be implemented, for example, by an integrated circuit such as an ASIC (Application Specific Integrated Circuit) or an FPGA (Field Programmable Gate Array).

The controller 130 includes a generation unit 131, a search unit 132, and an output controller 133 and implements or executes functions and operations of information processing to be described below. The internal configuration of the controller 130 is not limited to the configurations illustrated in FIGS. 1A and 1B but may be other configurations as long as they may perform the information processing (to be described later).

Figure 7A:
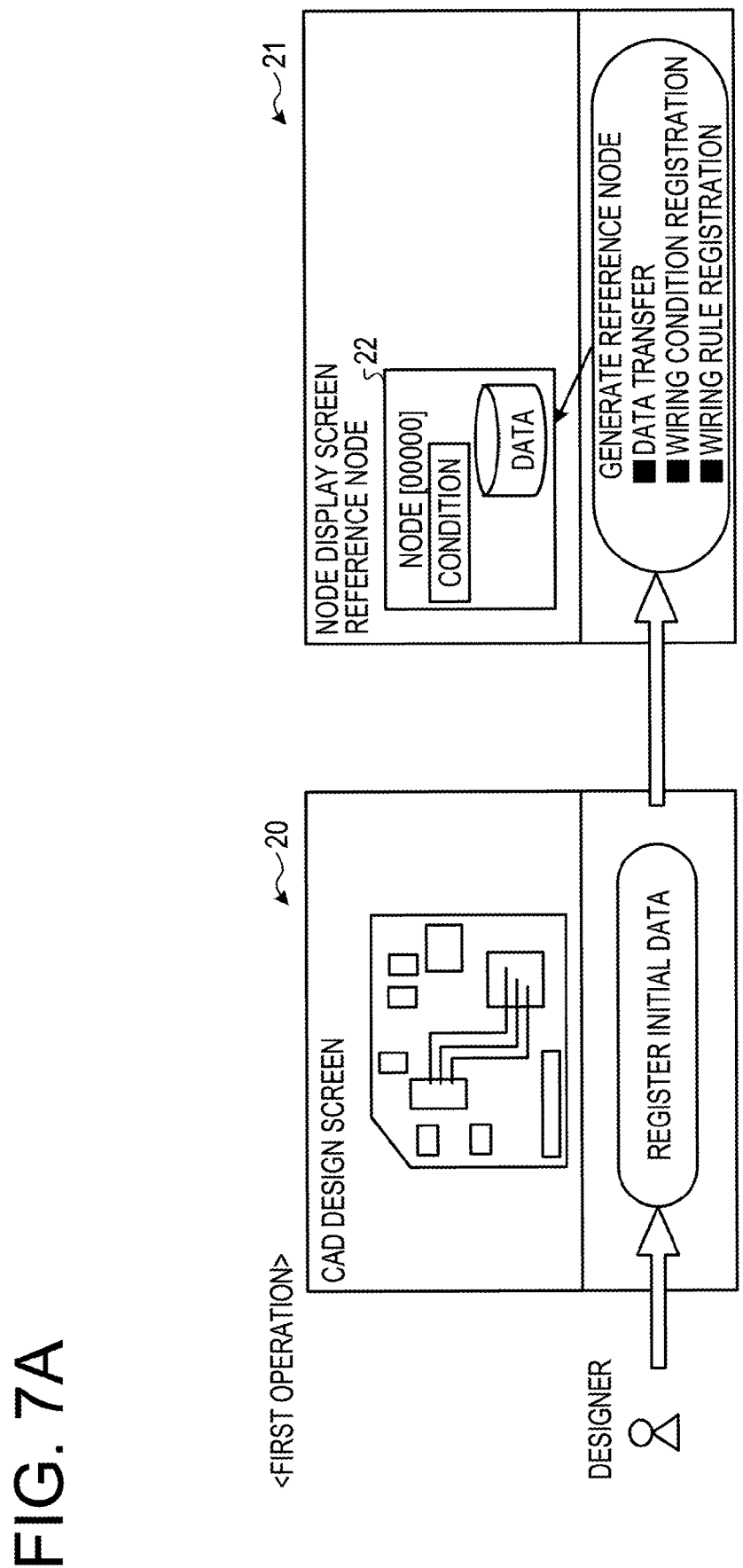
FIGS. 7A and 7B are views for explaining the outline of a node generating process.
Figure 7B:
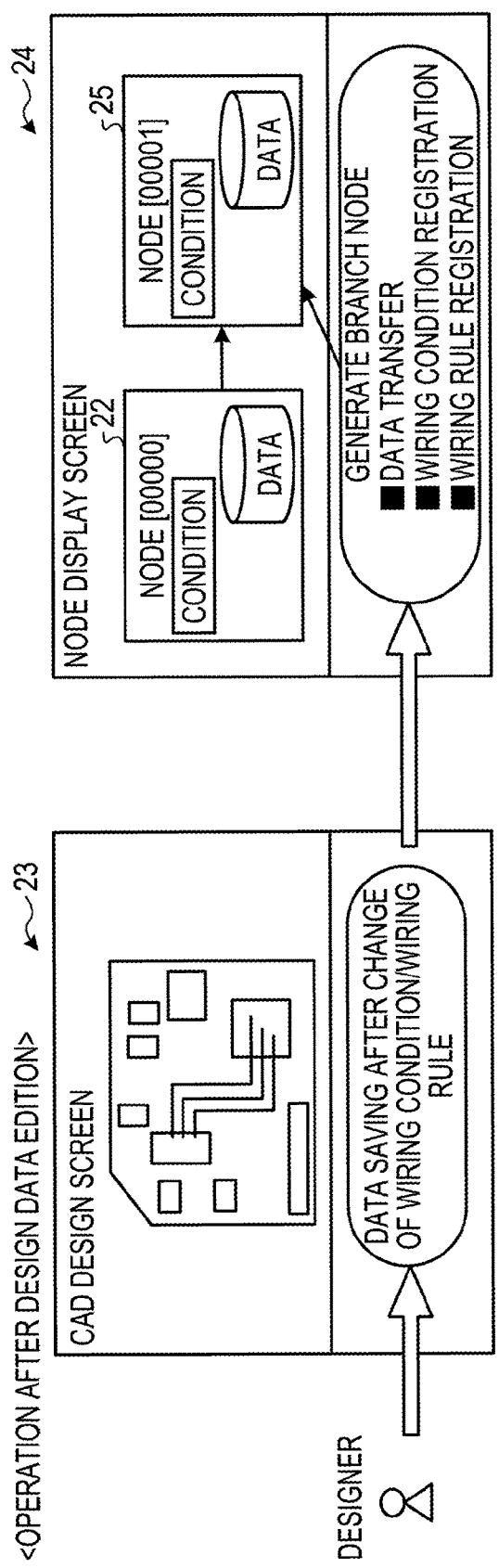

First, with reference to FIGS. 7A and 7B, descriptions will be made on the outline of a node generating process performed by the information processing apparatus 100. FIGS. 7A and 7B are views for explaining the outline of a node generating process. As illustrated in FIG. 7A, the designer of a printed wiring board registers initial data after performing an initial design work on a CAD design screen 20. It is assumed that the CAD 101 operates on the information processing apparatus 100. The information processing apparatus 100 receives transfer of design data from the CAD 101, performs a wiring condition registration and a wiring rule registration, and generates a reference node. The information processing apparatus 100 displays the generated reference node 22 on a node display screen 21.

Subsequently, as illustrated in FIG. 7B, the designer of the printed circuit board saves the design data, for example, after changing the wiring conditions and the wiring rule on a CAD design screen 23. The node generating process executed by the information processing apparatus 100 is to receive the transfer of the design data from the CAD 101, perform a wiring condition registration and a wiring rule registration, and generate a branch node 25. The information processing apparatus 100 displays the existing reference node 22 and the generated branch node 25 on a node display screen 24. In this manner, in the information processing apparatus 100, when designing and editing a printed wiring board using the CAD 101, a trial result is added as a node. In the following description, the node generating process will be described separately for a data structure generating process and a node arranging process.

Referring back to FIGS. 1A and 1B, the generation unit 131 generates common information and node information based on the design data at the time of initial operation, and stores the common information and the node information in the common information storage unit 121 and the node information storage unit 122, respectively. That is, the generation unit 131 receives the transfer of design data from the CAD 101 and executes the data structure generating process. The generation unit 131 registers wiring condition items for a node based on an input from the designer. The generation unit 131 stores the registered wiring condition items in the wiring condition item definition 121c of the common information storage unit 121.

The generation unit 131 receives, from the designer, the setting of the priority for the wiring condition items stored in the wiring condition item definition 121c. The generation unit 131 stores the received priority setting in the wiring condition registration definition 121*d* of the common information storage unit 121. The wiring condition item registration and the priority setting may be executed once at the start of a project.

Figure 8:
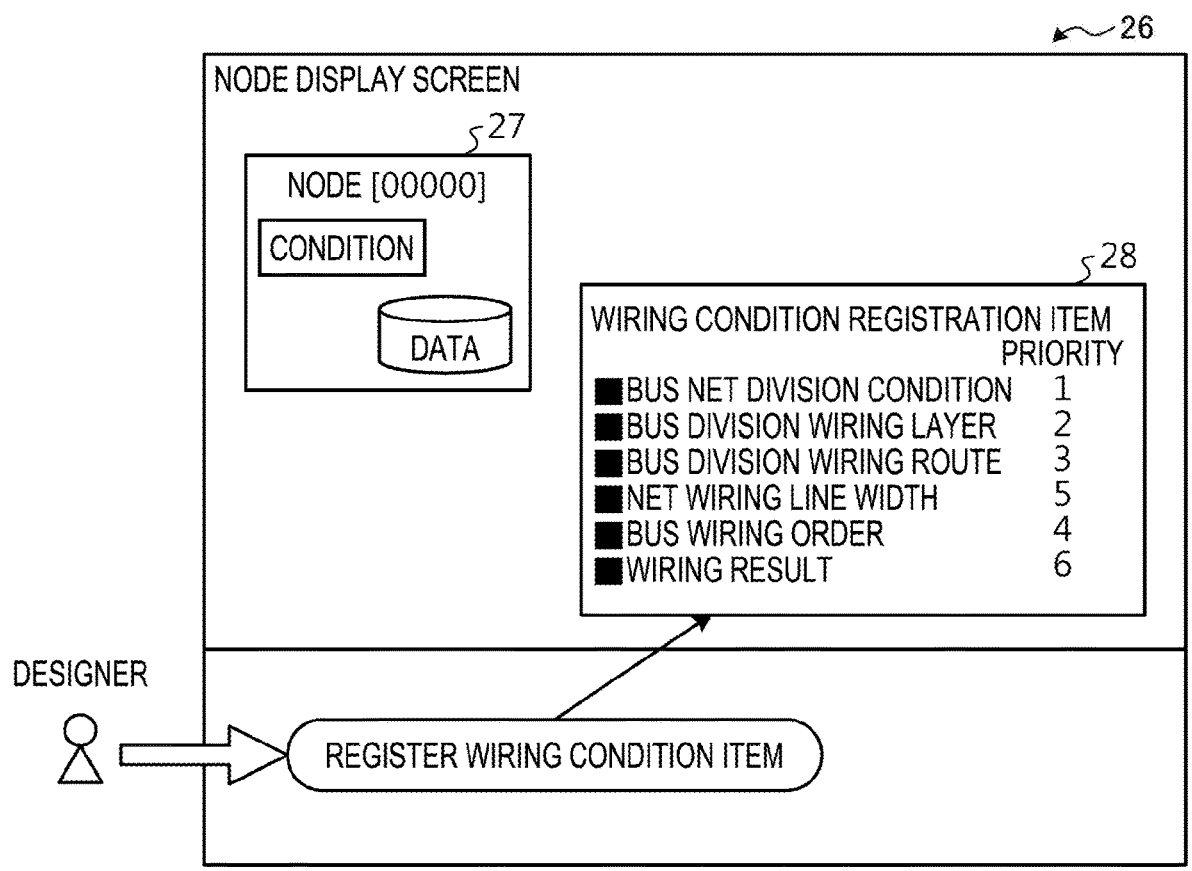
FIG. 8 is a view illustrating an example of registration of wiring condition items in a node.

FIG. 8 is a view illustrating an example of registration of wiring condition items in a node. As illustrated in FIG. 8, when wiring condition items and their respective priorities to be registered are input by a designer, the generation unit 131 stores the respective information in the common information storage unit 121 and displays a reference node 27 and a wiring condition registration item 28 on a node display screen 26. In the wiring condition registration item 28, the input and registered wiring condition registration items and the priorities are displayed in association.

The generation unit 131 generates the node basic information 122A1 based on the design data. Next, the generation unit 131 generates the child node management information 122A2, the wiring condition information 122C1, the wiring rule information 122D1, and the wiring difference information 122E1 linked from the node basic information 122A1. The child node management information 122A2 and the wiring difference information 122E1 have an empty data structure in the case of the initial operation.

The generation unit 131 extracts data corresponding to the wiring condition registration item from the design data based on the design data and the wiring condition registration item which is the registered wiring condition item. The generation unit 131 generates the wiring condition information 122C1, which is the data structure of the wiring condition information, and the subordinate bus definition 122C2, the bus instruction path definition 122C3, the affiliated bus net definition 122C4, and the bus automatic wiring order definition 122C5 from the extracted data.

Figure 9:
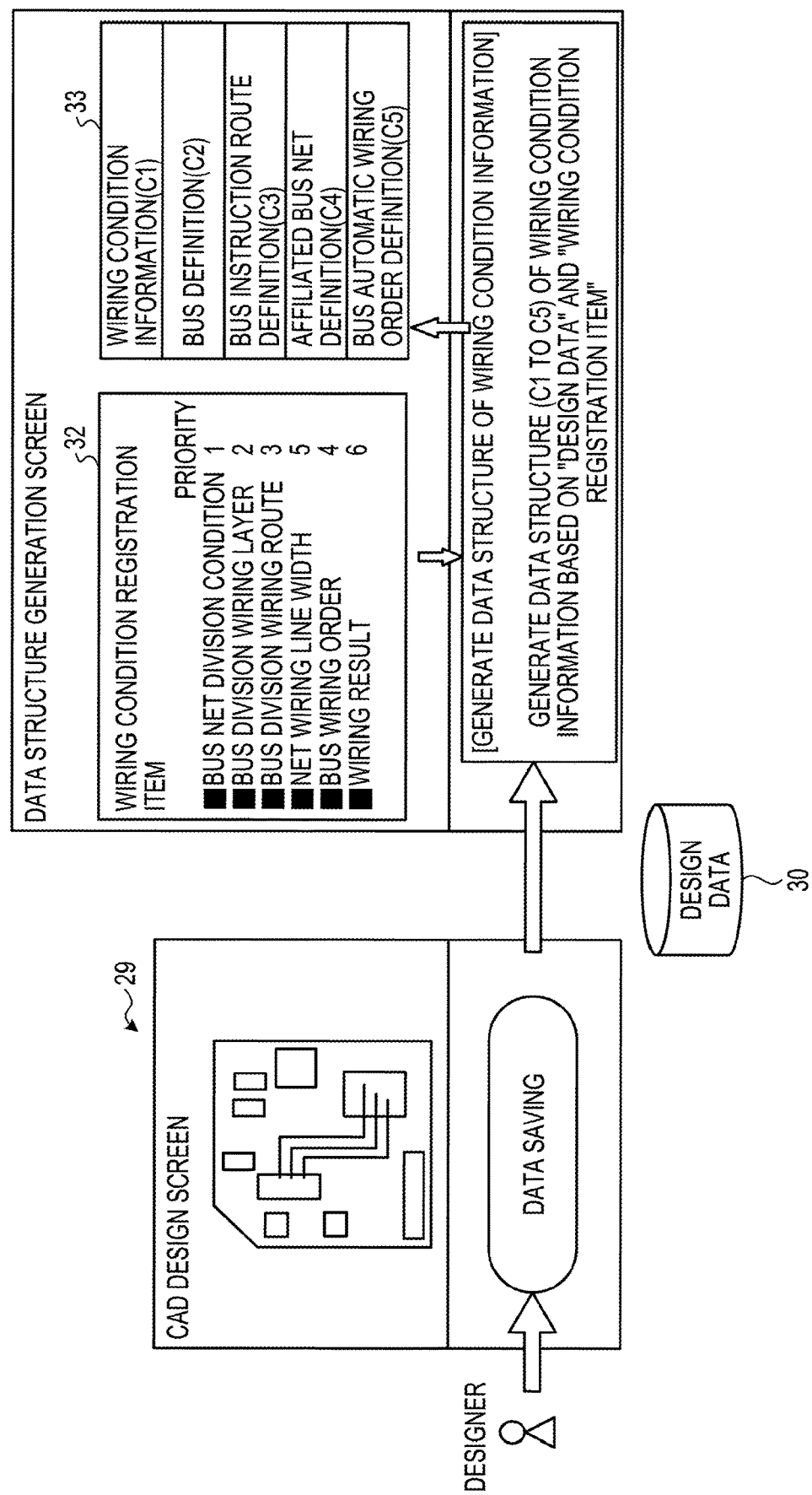
FIG. 9 is a view illustrating an example of generation of a data structure of wiring condition information.

FIG. 9 is a view illustrating an example of generation of the data structure of the wiring condition information. As illustrated in FIG. 9, when design data 30 is saved by a designer on a CAD design screen 29, the generation unit 131 generates the wiring condition information 122C1 and the subordinate data structure. For example, as illustrated in a data structure generation screen 31, the generation unit 131 may display a wiring condition registration item 32 and wiring condition information 33 so as to let the designer know what kind of data structure is generated. In FIG. 9, symbols C1 to C5 correspond to the wiring condition information 122C1 to the bus automatic wiring order definition 122C5.

Similarly, the generation unit 131 generates the wiring rule information 122D1, which is the data structure of the wiring rule information, and the subordinate net line width definition 122D2 from the extracted data.

Figure 10:
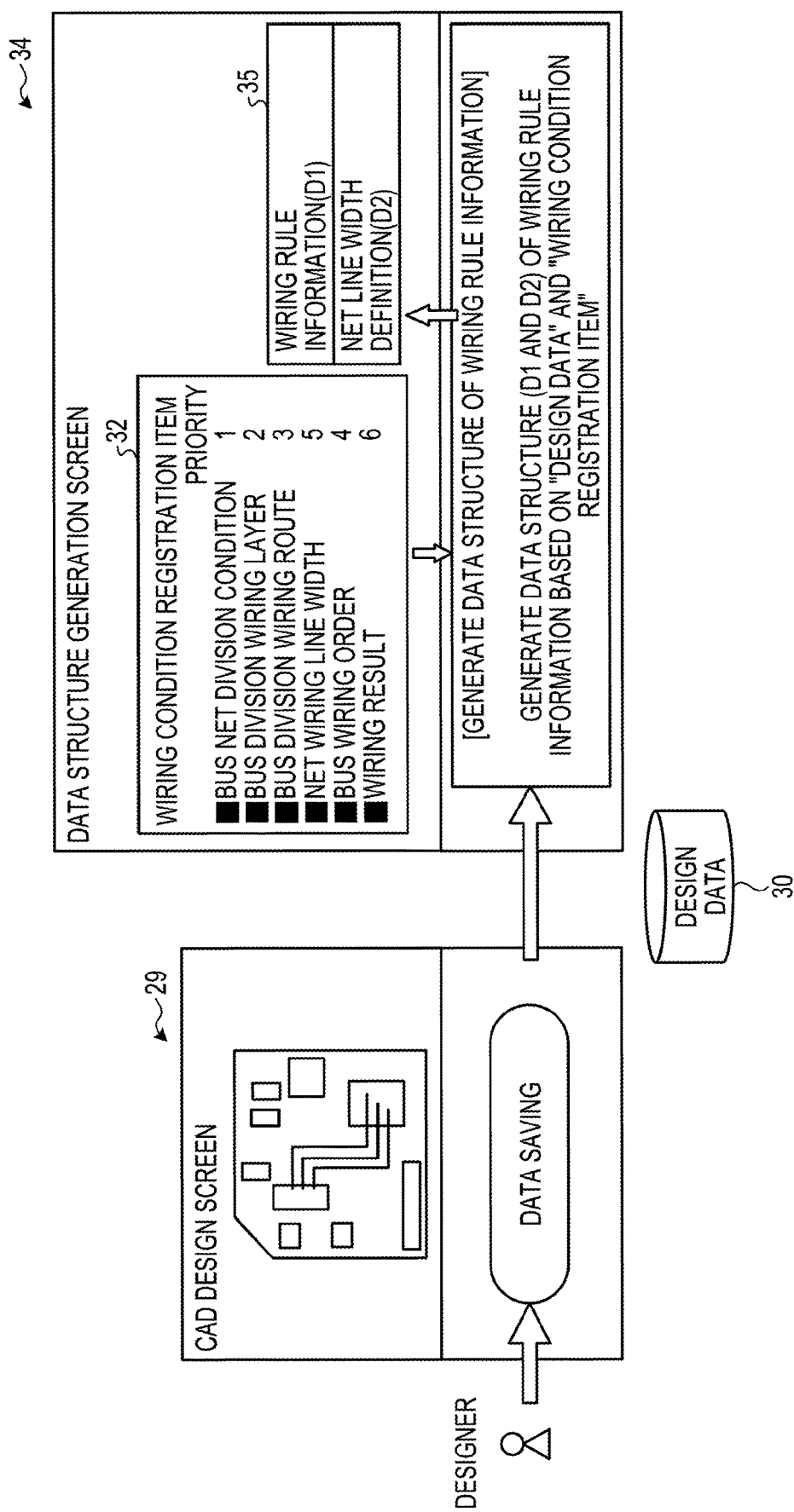
FIG. 10 is a view illustrating an example of generation of a data structure of wiring rule information.

FIG. 10 is a view illustrating an example of generation of the data structure of the wiring rule information. As illustrated in FIG. 10, when the design data 30 is saved by a designer on a CAD design screen 29, the generation unit 131 generates the wiring rule information 122D1 and the subordinate data structure. For example, as illustrated in a data structure generation screen 34, the generation unit 131 may display a wiring condition registration item 32 and wiring rule information 35 so as to let the designer know what kind of data structure is generated.

Similarly, the generation unit 131 generates the wiring difference information 122E1, which is the data structure of the wiring difference information, and the subordinate net wiring information 122E2 from the extracted data.

Figure 11:
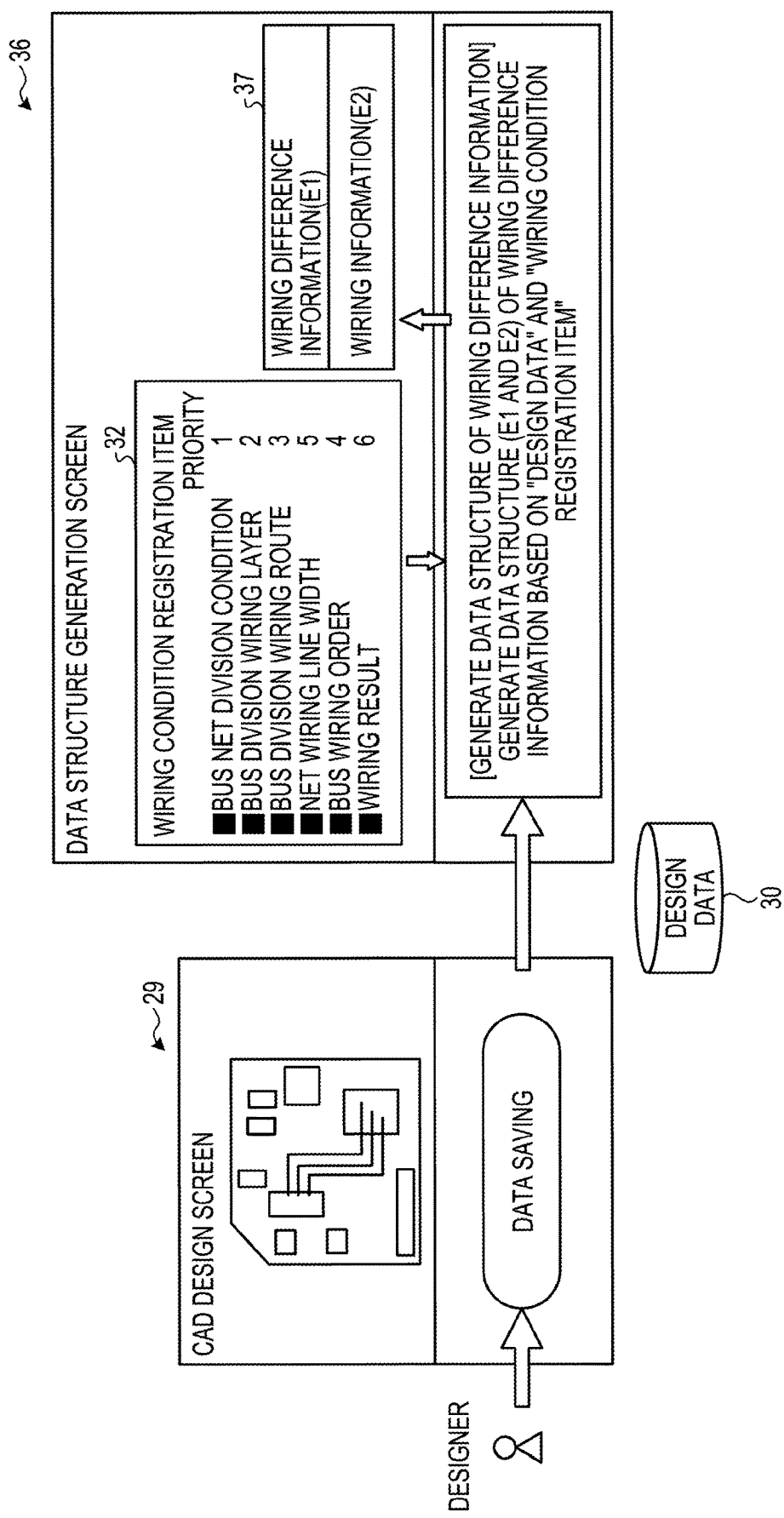
FIG. 11 is a view illustrating an example of generation of a data structure of wiring difference information.

FIG. 11 is a view illustrating an example of generation of the data structure of the wiring difference information. As illustrated in FIG. 11, when the design data 30 is saved by a designer on a CAD design screen 29, the generation unit 131 generates the wiring difference information 122E1 and the subordinate data structure. For example, as illustrated in a data structure generation screen 36, the generation unit 131 may display a wiring condition registration item 32 and wiring difference information 37 so as to let the designer know what kind of data structure is generated.

At the time of the second storage or thereafter, the generation unit 131 receives the transfer of design data from the CAD 101 and generates a node corresponding to the design data at the time of storage by generating a data structure of the wiring condition information, the wiring rule information, and the wiring difference information.

Upon completion of generation of the data structure of the node, the generation unit 131 executes a node arranging process of determining where to place the node in the tree structure. The generation unit 131 refers to the common information storage unit 121 to set the number of registrations of the wiring condition item to M. Assuming that the design data at the time of storage is design data S, the generation unit 131 generates the data structure of the above-described wiring condition information, wiring rule information, and wiring difference information based on the design data S.

Based on the set value M, the generation unit 131 sets a numerical value with all M digits "9" as the minimum comparison number. That is, for example, for the set value M=6, the initial value of the minimum comparison number is set as "999999".

The generation unit 131 adds a root node ID to a check node set representing nodes to be checked. The generation unit 131 substitutes the head node ID of the check node set into a check node ID indicating a check target node of node arrangement. The generation unit 131 calculates a comparison number based on each data structure of the design data S and each data structure of the check node indicated by the check node ID.

Figure 12:
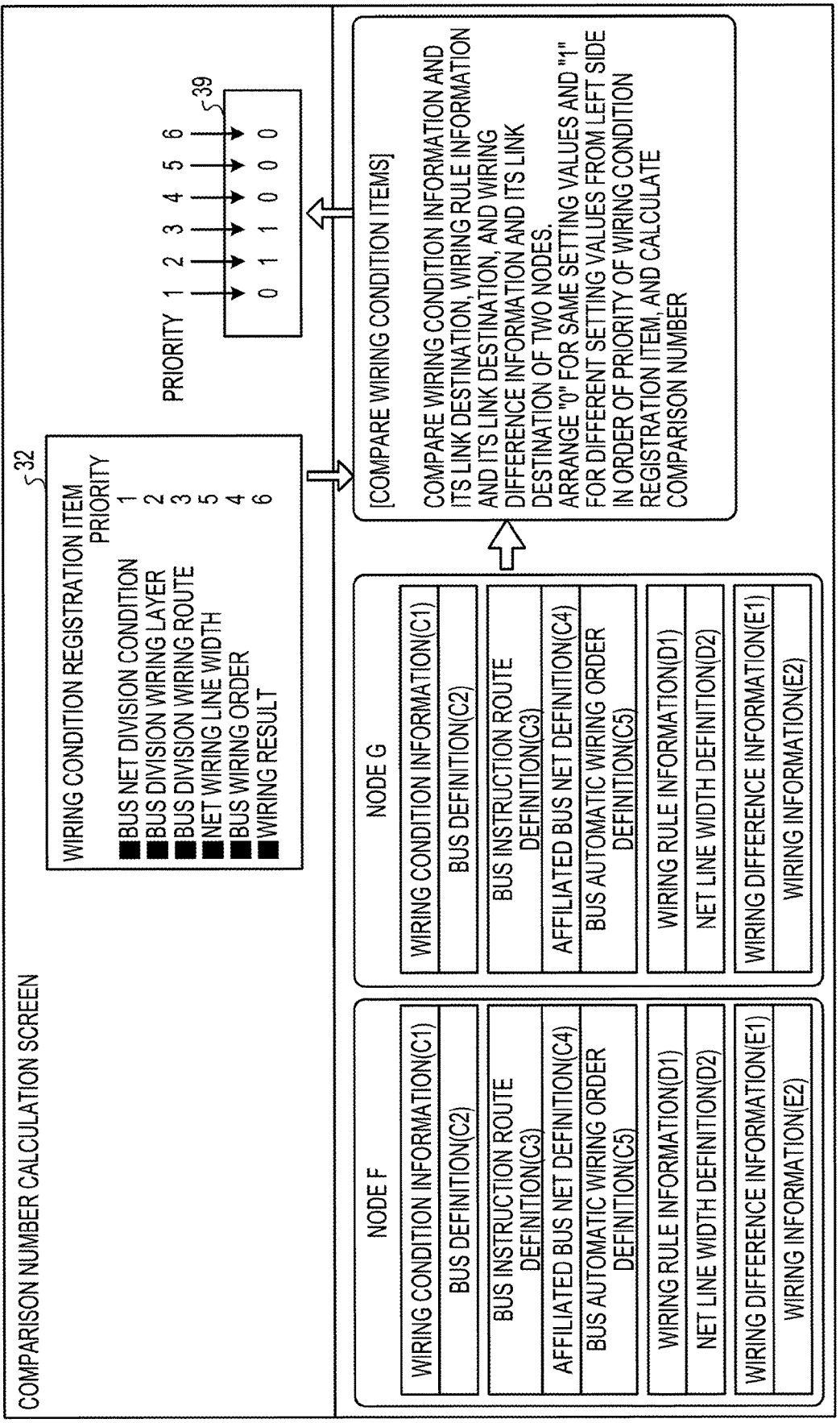
FIG. 12 is a view illustrating an example of calculation of a comparison number.

Here, calculation of a comparison number will be described with reference to FIG. 12. FIG. 12 is a view illustrating an example of calculation of a comparison number. As illustrated in FIG. 12, the generation unit 131 compares wiring condition items of the wiring condition registration item 32 between the data structure of a node F to be checked and the data structure of a node G corresponding to the design data S at the time of storage. That is, the generation unit 131 compares the wiring condition information and its link destination, the wiring rule information and its link destination, and the wiring difference information and its link destination of the two nodes. The generation unit 131 calculates a comparison number by arranging "0" for the same setting values and "1" for different setting values from the left side in order of priority of the wiring condition registration item 32. For example, since a comparison number 39 on a comparison number calculation screen 38 is "011000", a node F and a node G indicate that the wiring layer of the bus division of the priority "2" is different from the wiring route of the bus division of the priority "3". At the time of comparing the comparison numbers, the generation unit 131 may display the comparison number calculation screen 38 and display a process of calculating the comparison numbers to the designer.

The generation unit 131 determines whether the calculated comparison number is less than the minimum comparison number. When it is determined that the comparison number is less than the minimum comparison number, the generation unit 131 substitutes the comparison number for the minimum comparison number. Further, the generation unit 131 substitutes the check node ID for the minimum node ID. The generator 131 adds the node IDs of all the child nodes of the check node to the tail of the check node set in order.

In the meantime, when it is determined that the comparison number is not less than the minimum comparison number, the generation unit 131 adds the node IDs of all the child nodes of the check node to the tail of the check node set in order without substituting the comparison number for the minimum comparison number and the check node ID for the minimum node ID.

When adding the node IDs of the child nodes to the check node set, the generation unit 131 deletes the check node ID at the head of the check node set. That is, the generation unit 131 deletes the check target node with determined comparison number from the check node set. The generation unit 131 determines whether the check node set is empty. When it is determined that the check node set is not empty, the generation unit 131 proceeds to the determination of the comparison number of the next check node.

When it is determined that the check node set is empty, the generation unit 131 determines that the subordinate of a node indicated by the minimum node ID is at the arrangement position of the node corresponding to the design data S. The generation unit 131 stores the node basic information 122A1 corresponding to the design data S and the information of the subordinate thereof in the node information storage unit 122 based on the determined arrangement position of the node.

That is, when the bus wiring conditions are changed or the wiring result based on the bus wiring conditions is generated, the generation unit 131 generates a first node. In addition, the generation unit 131 associates the generated first node with the bus wiring conditions and the design data after the change of the bus wiring conditions, or associates the generated first node with the bus wiring conditions, the wiring result, and the design data after the generation of the wiring result, and stores the association in the storage unit.

Figure 13:
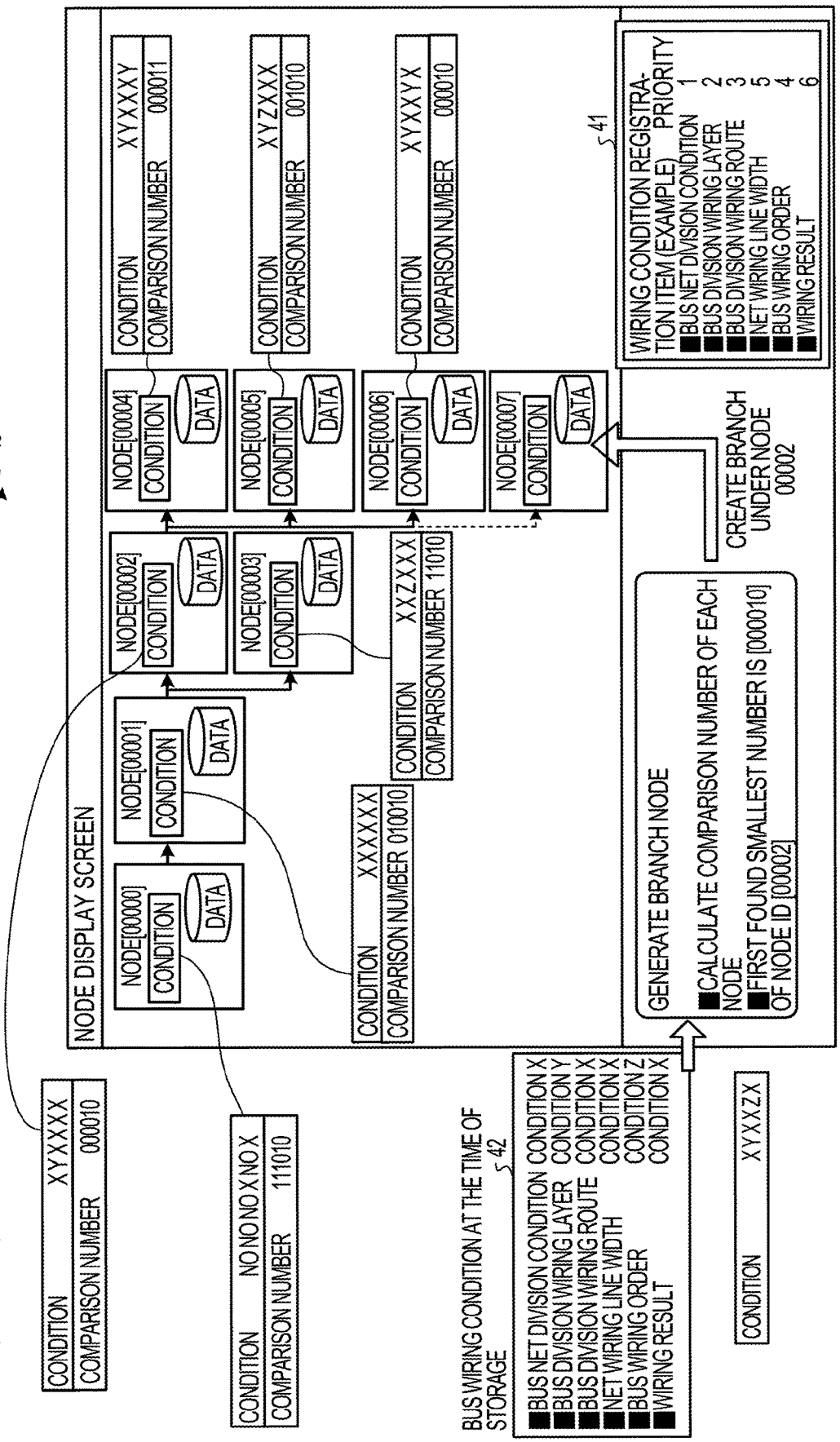
FIG. 13 is a view illustrating an example of a comparison number in each node of a tree structure.

Here, a specific example of node arrangement will be described with reference to FIG. 13. FIG. 13 is a view illustrating an example of a comparison number in each node of a tree structure. For example, a node display screen 40 of FIG. 13 represents a case where a new node (branch node) indicated by a node ID "00007" is saved instead of the existing nodes with the node IDs "00000" to "00006". It is assumed that the wiring condition registration item used at this time is the wiring condition registration item 41.

The generation unit 131 calculates the comparison number with the bus wiring condition 42 corresponding to the design data at the time of storage in order from the node ID "00000" which is a root node. As a result of calculating the comparison number of each node, the generation unit 131 finds the smallest number first, which is the comparison number "000010" of the node ID "00002". Therefore, the generation unit 131 adds a new node as a node ID "00007" under the node ID "00002". Although a node ID "00006" of the comparison number "000010" exists under the node ID "00002", since checking is sequentially made from the root node of the tree structure, the new node is not under the node ID "00006." In other words, the generation unit 131 searches for a destination to which the new node is to be added in the breadth-first search and gives priority to the previously found node. When the node ID of the comparison number "000000" is found, since the bus wiring condition of the node is the same as the bus wiring condition of the design data to be saved, the generation unit 131 does not generate a new node.

In other words, the generation unit 131 generates a first node to provide a tree structure having a reference node as a root node and the first node as a child node. In addition, when generating the first node, the generation unit 131 calculates a difference between the bus wiring condition corresponding to the first node and the bus wiring condition of the existing node by using the breadth-first search in order from the root node, and generates the first node under the existing node with the calculated smallest difference. Further, when the bus wiring condition has plural items, the generation unit 131 gives priority to the items, calculates a value indicating the presence/absence of the difference for each item having the higher priority item as the higher order digit, and generates the first node under the existing node with the calculated smallest value. Further, the generation unit 131 compares the wiring condition information on the bus, the wiring rule information on the wiring rule on a board, and the wiring difference information on the wiring difference between the parent node and the child nodes, and calculates a difference for each item between the generated first node and the existing node. Further, the bus wiring condition includes one or more pieces of information among the bus net definition, the bus wiring target layer, the bus route, the bus automatic wiring priority order, the net line width, and the wiring result.

Referring back to FIGS. 1A and 1B, the search unit 132 searches for a node based on an instruction from the designer. For example, the search unit 132 receives a selection of a project from the designer. Upon receiving the selection of the project, the search unit 132 refers to the common information storage unit 121 and the node information storage unit 122, and displays on the display unit 111 a node display screen that displays the tree structure of the project.

For example, when the detailed search is selected among menu items on the node display screen, the search unit 132 determines whether to narrow down a node. When it is determined that the node is to be narrowed down, the search unit 132 receives the narrowing-down condition in the detailed search and displays a node display screen with the narrowed-down node. When it is determined that the node is not to be narrowed down, the search unit 132 continues to display the node display screen which is being displayed.

For example, when the condition difference display is selected among the menu items on the node display screen, the search unit 132 determines whether to compare two nodes. When it is determined that the nodes are to be compared, the search unit 132 receives a selection of the nodes to be compared on the node display screen and displays the comparison result. When it is determined that the nodes are not to be compared, the search unit 132 continues to display the node display screen which is being displayed.

The search unit 132 receives a designation of a node on the node display screen. The search unit 132 refers to the node information storage unit 122 and outputs the design data corresponding to the designated node to the output controller 133.

When the design data is input from the search unit 132, the output controller 133 transfers the design data to the CAD 101. The CAD 101 reads the design data transferred from the output controller 133 and displays the read design data on a CAD design screen so that it is editable by the designer.

That is, upon receiving a designation of the bus wiring condition, the search unit 132 searches for a second node that matches the designated bus wiring condition. In addition, the search unit 132 displays a tree structure matching a predetermined search condition and receives the designation of the bus wiring condition by receiving the designation of the node included in the displayed tree structure. In addition, the search unit 132 displays the tree structure and receives a designation of two nodes included in the displayed tree structure. In addition, the search unit 132 displays a difference in the bus wiring condition between the two received nodes, and receives a designation of the bus wiring condition by receiving a designation of one of the two nodes. Further, the output controller 133 outputs the design data corresponding to the searched node.

Figure 14A:
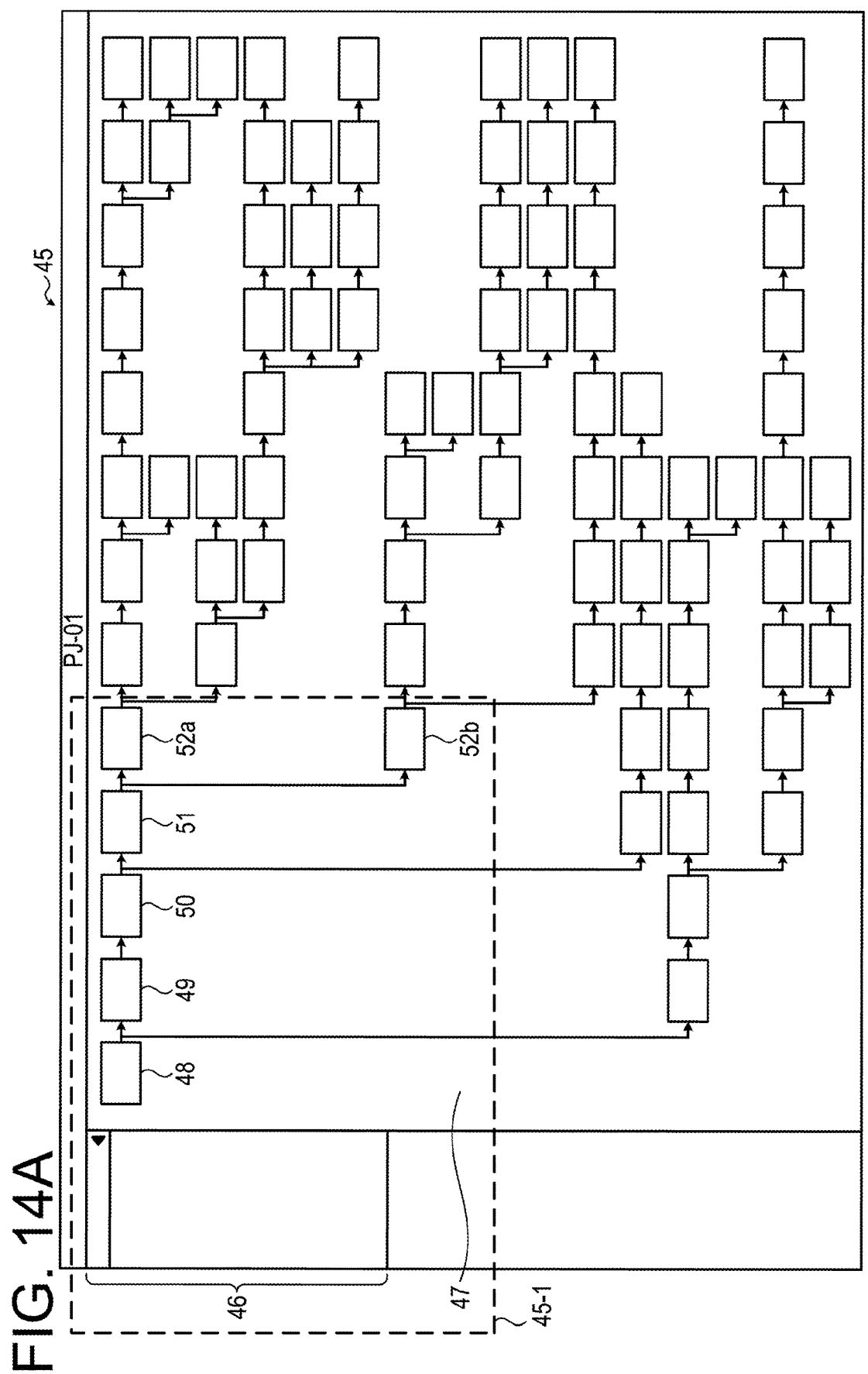
FIGS. 14A and 14B are views illustrating an example of a node display screen.
Figure 14B:
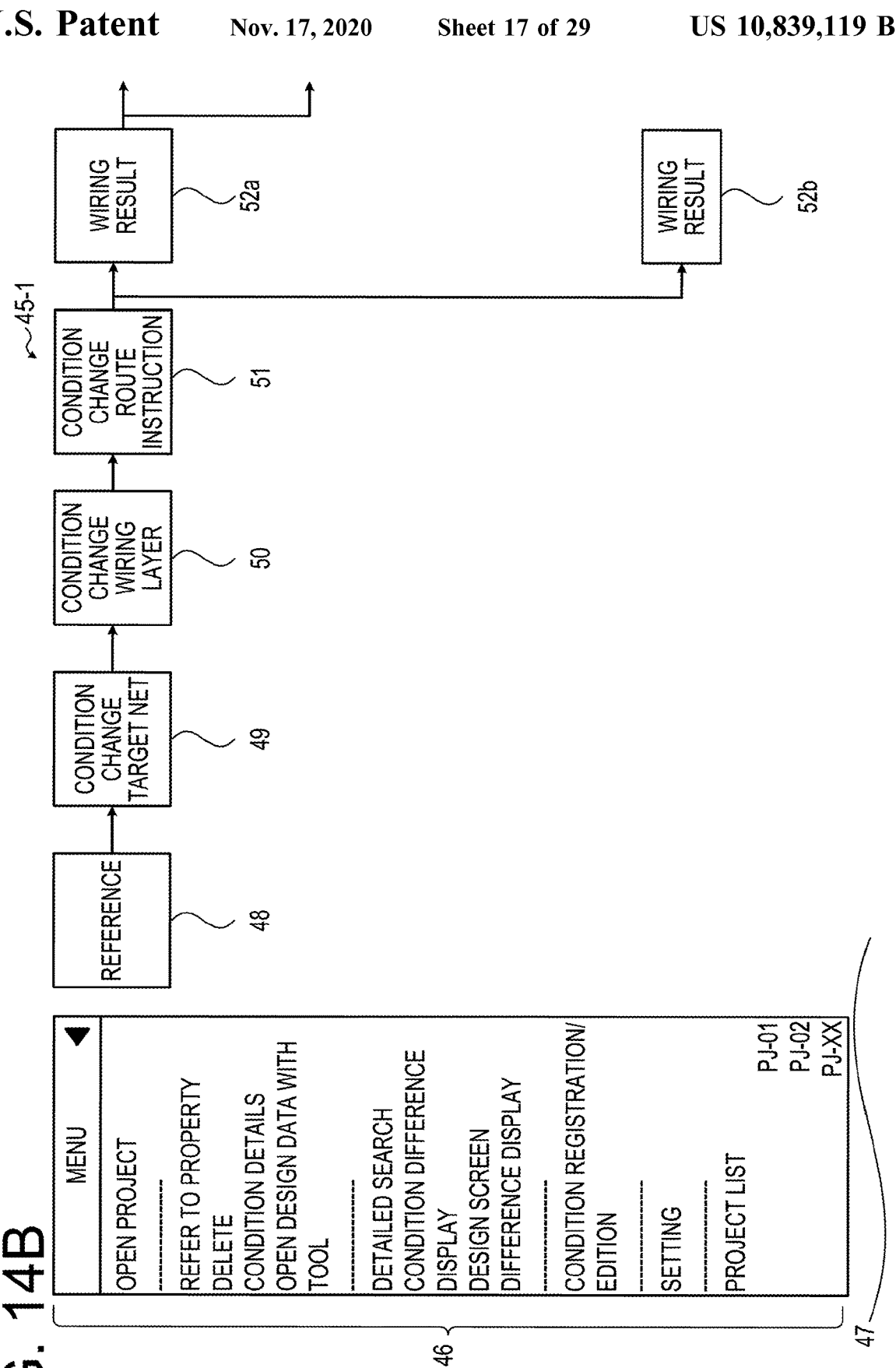

Here, a node display screen and a selection of a node will be described with reference to FIG. 14A to FIG. 18. FIG. 14A is a view illustrating an example of a node display screen. FIG. 14B is an enlarged view in a broken line frame 45-1. Although characters are omitted in FIG. 14A, the characters are actually displayed in each block and a menu section, as illustrated in FIG. 14B. As illustrated in FIG. 14A, a node display screen 45 includes a menu section 46 and a tree structure display section 47. For example, the node display screen 45 is assumed to correspond to a project "PJ-01". As illustrated in FIG. 14B, the menu section 46 has menu items such as "detailed search" for node narrowing-down, "difference condition display" for node comparison, and "opening design data with tool" for transfer of the design data of the selected node to CAD 101.

The tree structure display section 47 displays the tree structure of a project. In the tree structure, for example, a reference node 48, which is a root node, is displayed at the left end, and child nodes are sequentially displayed on the right side. The child nodes are generated, for example, each time the design data is saved in the CAD 101. On the node display screen 45, child nodes are generated, such as a node 49 with the changed condition of a target net from the reference node 48, a node 50 with the changed condition of a wiring layer from the node 49, and a node 51 with the changed condition of a route instruction from the node 50. Further, a node 52a of the wiring result and a node 52b of the wiring result are generated as child nodes in the same layer under the node 51. For example, since parameters or random numbers of automatic wiring are different, the nodes 52a and 52b become nodes representing different states as wiring results in a case where the wiring order differs. Hereinafter, similarly, a new node is generated on the node display screen 45 each time when a condition changes or an automatic wiring is performed from each node.

The child nodes under the node 52a indicate that the wiring result of the node 52a is used. The use of the wiring result indicates, for example, a case where, when there are three buses, the wiring result of the first bus is used to change the condition of the second bus or perform an automatic wiring. The child nodes may not perform an automatic wiring after a condition change. Further, although each node generates one node by saving the node once for one condition change, it is also possible to include two condition changes in one node.

Figure 15A:
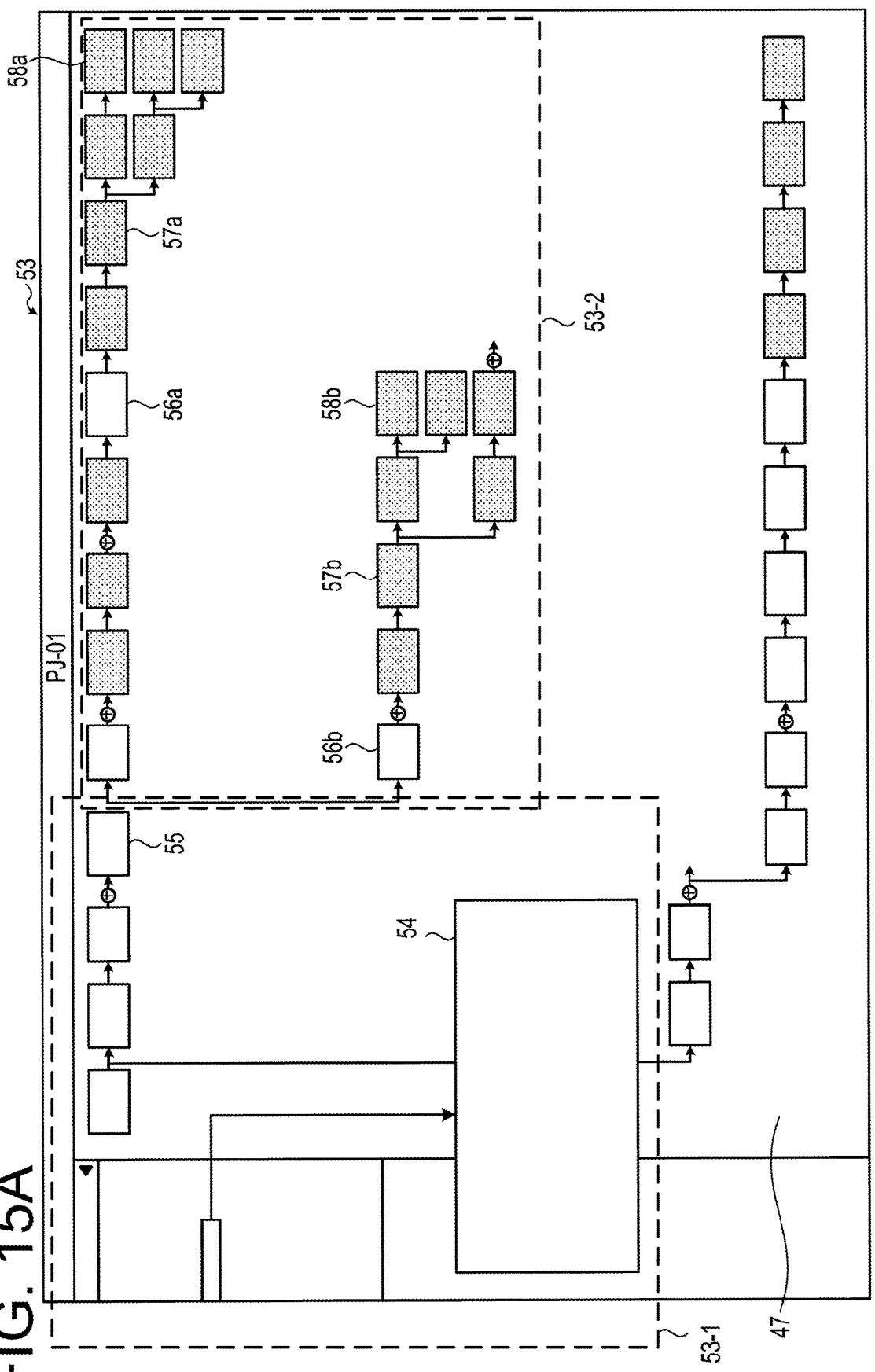
FIGS. 15A, 15B and 15C are views illustrating an example of node narrowing.
Figure 15B:
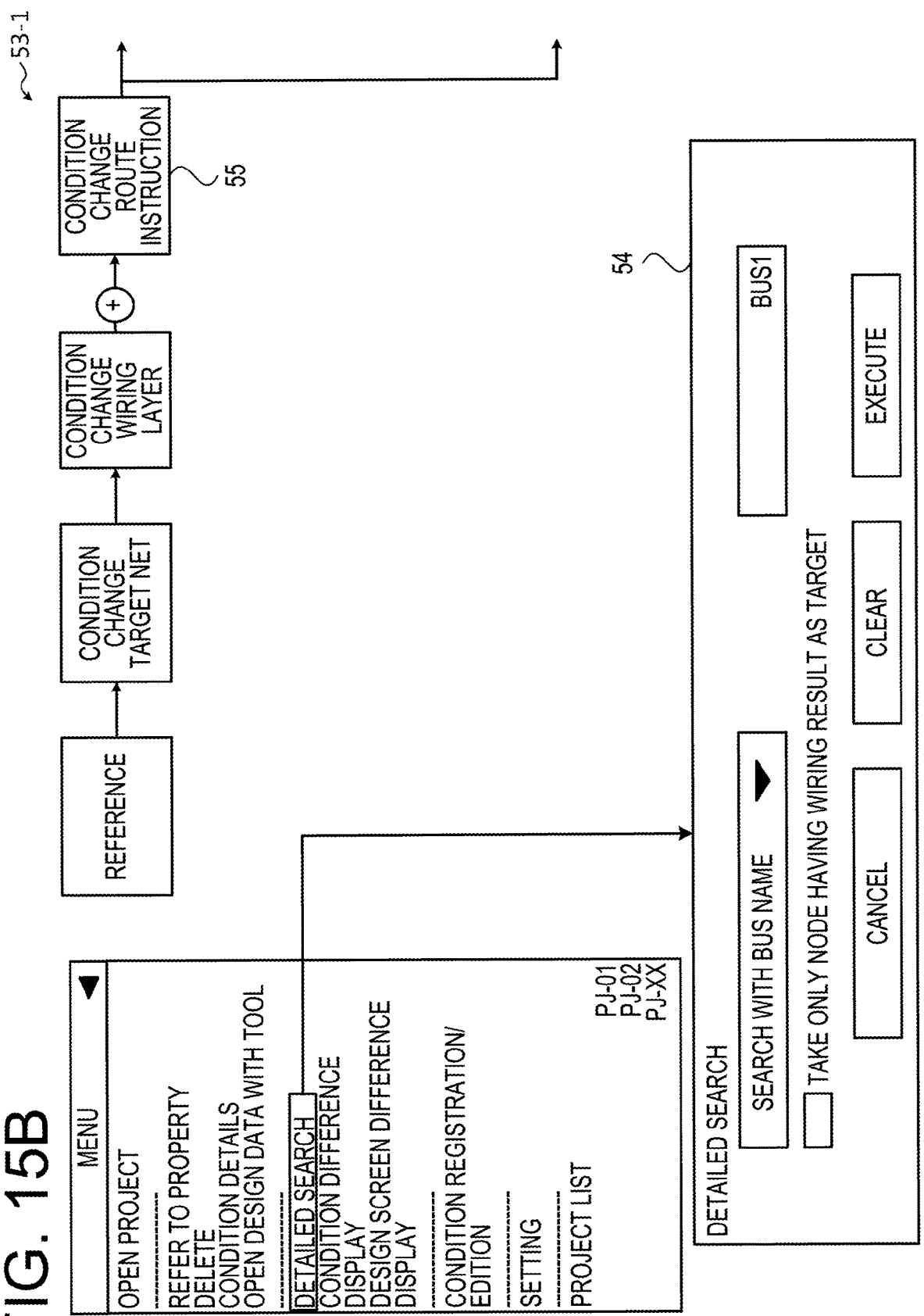
Figure 15C:
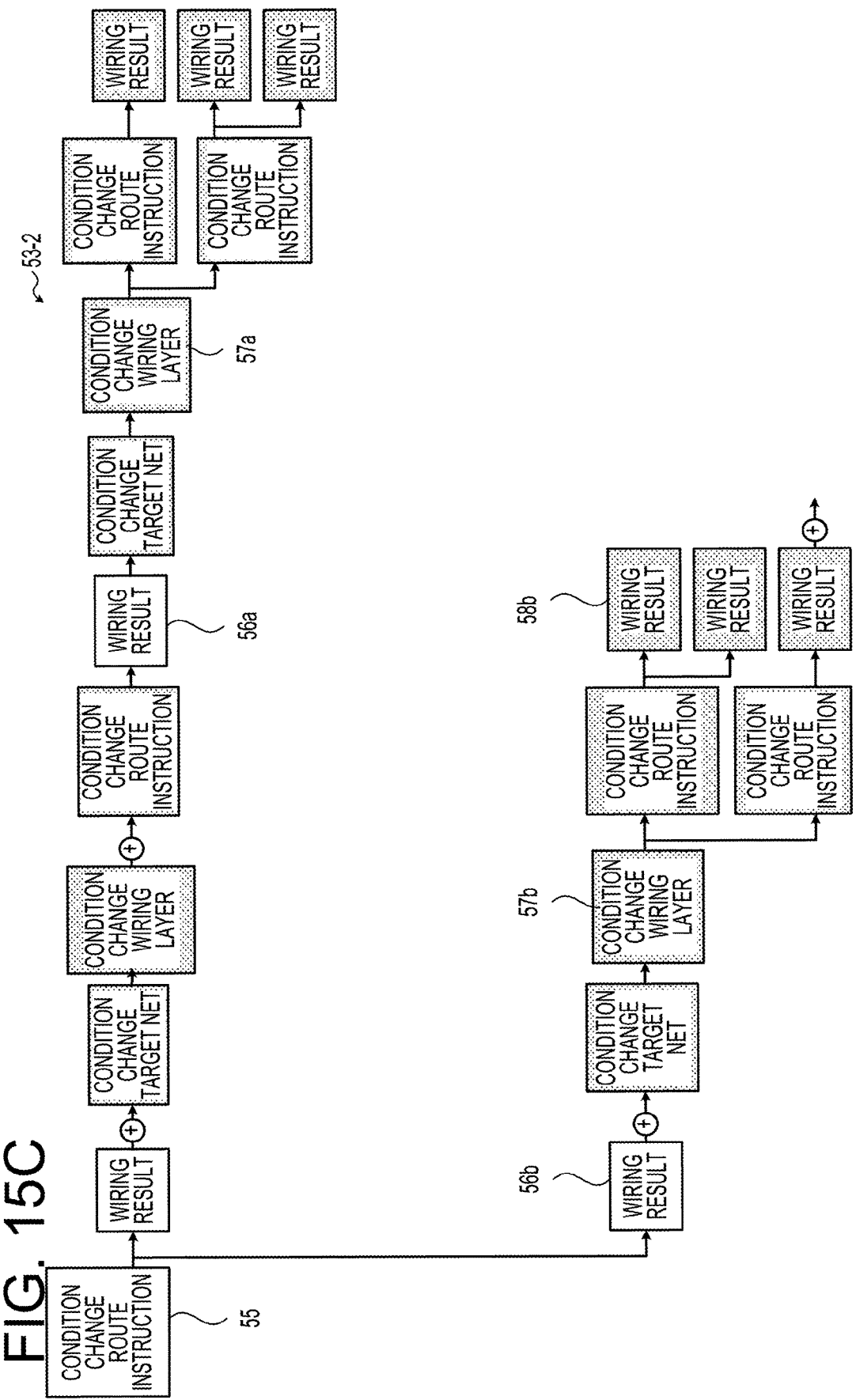

FIG. 15A is a view illustrating an example of narrowing-down of a node. FIG. 15B is an enlarged view in a broken line frame 53-1. FIG. 15C is an enlarged view in a broken line frame 53-2. In FIG. 15A, characters are omitted, but in reality, as illustrated in FIGS. 15B and 15C, the characters are displayed in each block and a menu section. A node display screen 53 illustrated in FIG. 15A receives the narrowing-down condition and represents a state in which a node id is narrowed down. On the node display screen 53, as illustrated in FIG. 15B, for example, a menu item "detailed search" is selected and a dialog box 54 is displayed. In the dialog box 54, the narrowing-down condition such as, for example, searching with a bus name "BUS1" is received. A tree structure corresponding to the narrowing-down condition input in the dialog box 54 is displayed on the node display screen 53. In addition to the bus name, for example, a layer name, a net name, a net line width, and a registration date/time may be used as the narrowing-down condition.

For example, as illustrated in FIG. 15C, for a node 55 as a comparison reference, a node 56a of the wiring result and a node 56b of the wiring result may be compared on the node display screen 53. Compared to the node 56b, it is assumed that the node 56a performs a condition change on the wiring around a bus indicated by the bus name "BUS1". By comparing the node 56a with the node 56b, the designer may compare indirect conditional differences such as the wiring around the bus. Similarly, the designer may compare the direct condition differences by comparing a node 57a further subjected to a condition change of the target net and a wiring layer from the node 56a, and a node 57b further subjected to a condition change of the target net and a wiring layer from the node 56b. Similarly, the designer may compare the wiring rate differences by comparing a node 58a indicating the wiring result subjected to a condition change of the route instruction and the automatic wiring from the node 57a, and a node 58b subjected to a condition change of the route instruction and the automatic wiring from the node 57b. In other words, the information processing apparatus 100 may support the consideration of a failure factor for a search target by displaying a tree structure from the relevant node with a certain node as a reference.

Figure 16A:
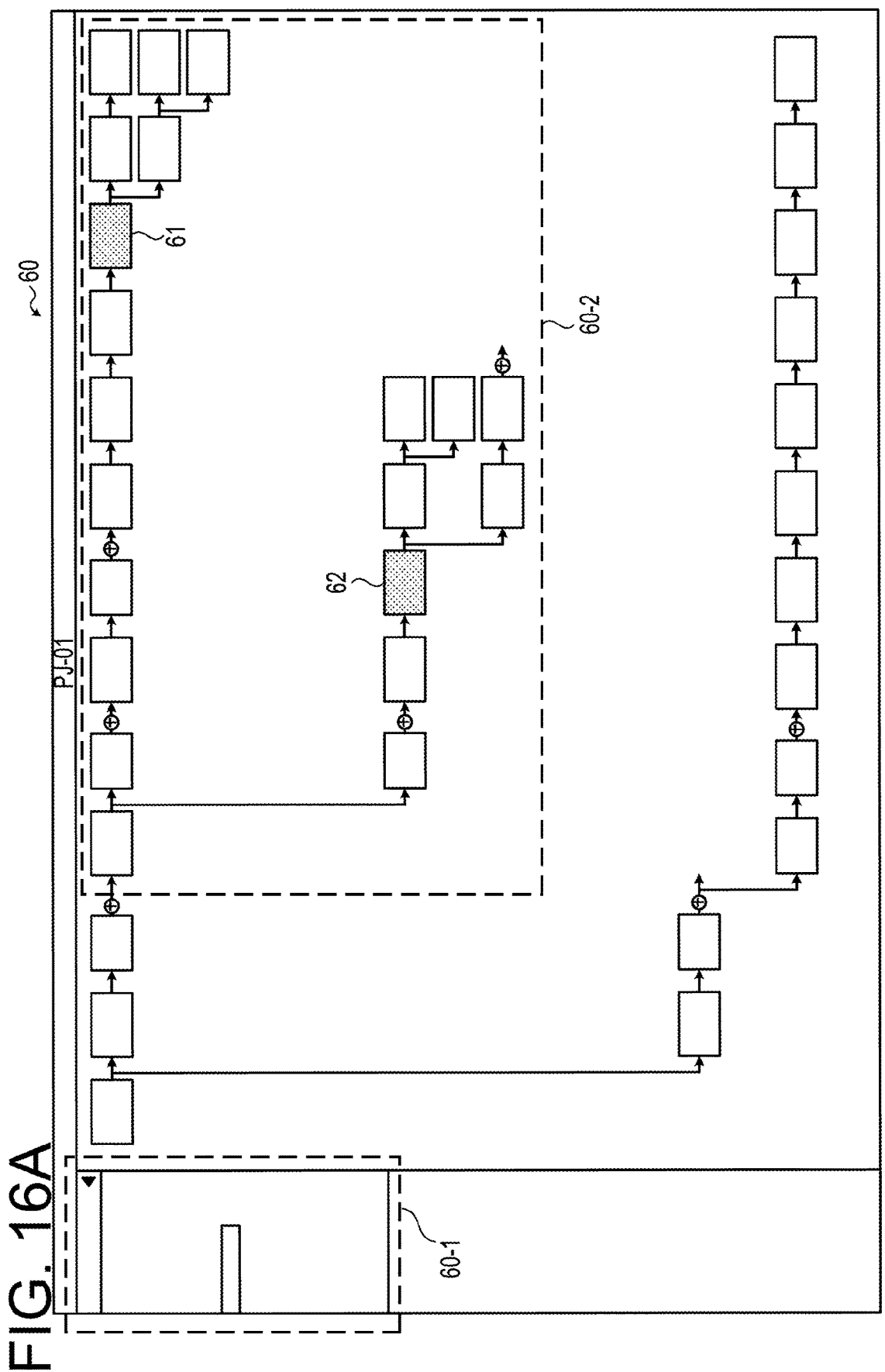
FIGS. 16A, 16B and 16C are views illustrating an example of selection of two nodes to be compared.
Figure 16B:
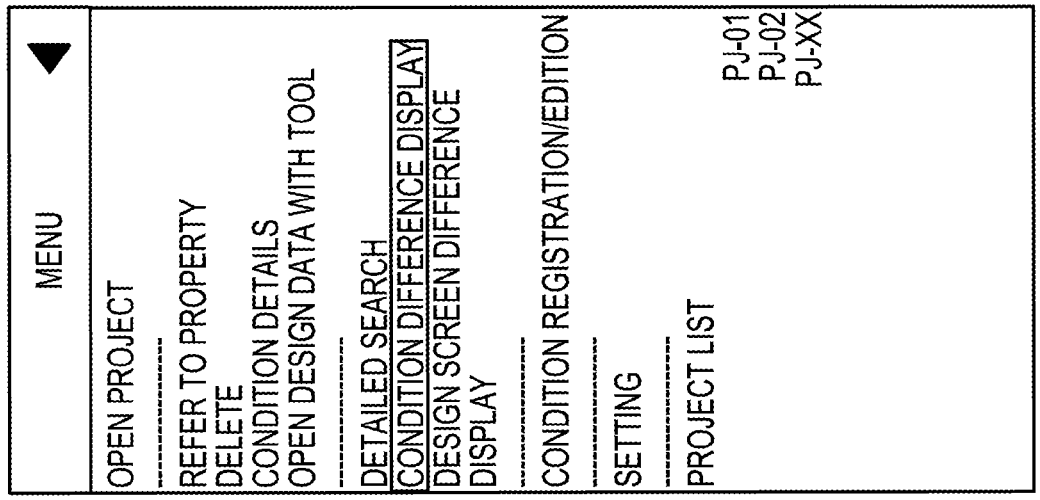
Figure 16C:
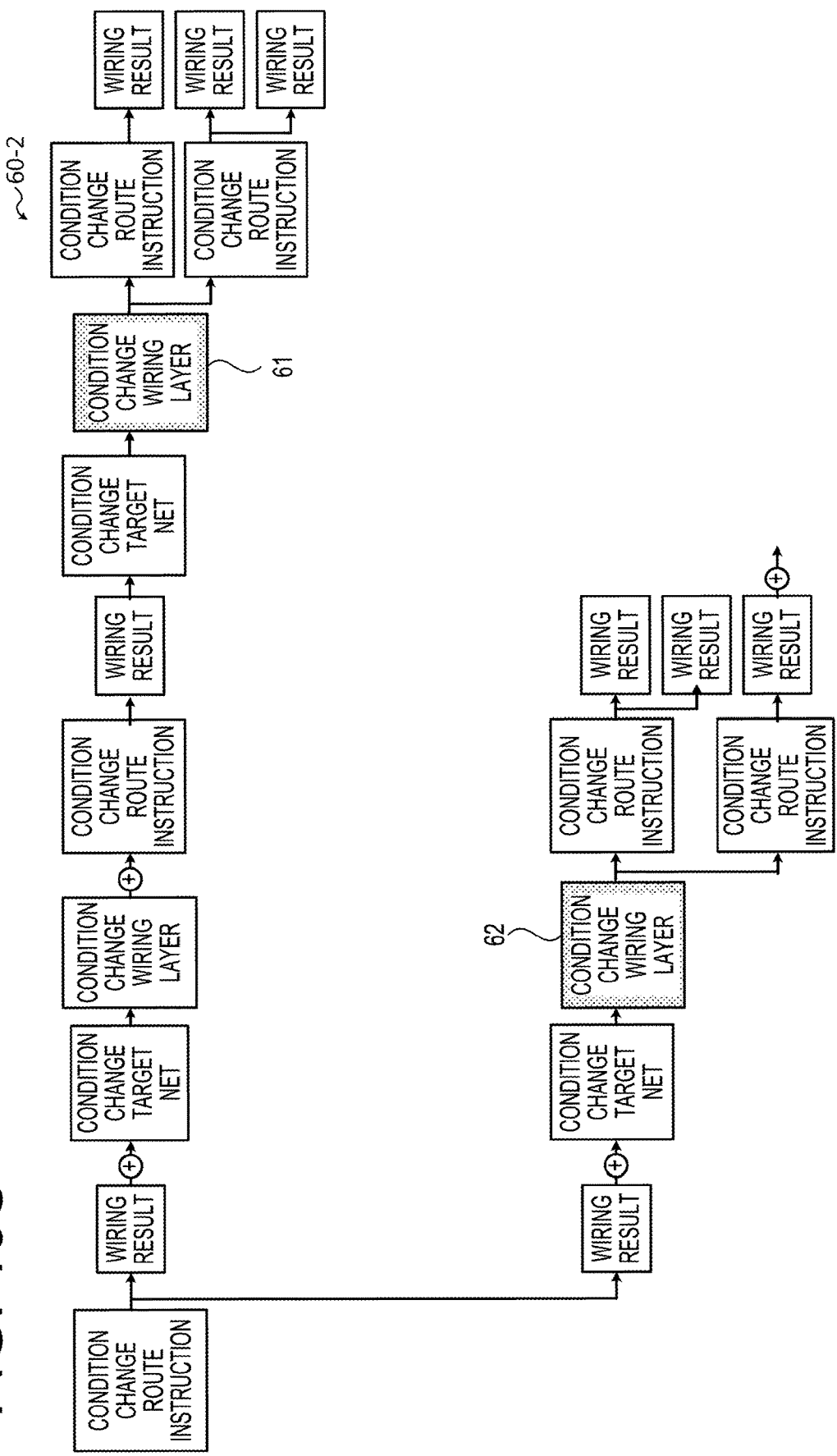

FIG. 16A is a view illustrating an example of a selection of two nodes to be compared. FIG. 16B is an enlarged view in a broken line frame 60-1. FIG. 16C is an enlarged view in a broken line frame 60-2. Although characters are omitted in FIG. 16A, the characters are actually displayed in each block and a menu section, as illustrated in FIGS. 16B and 16C. A node display screen 60 illustrated in FIG. 16A represents a state in which a node is narrowed-down, as in the node display screen 53. In the node display screen 60, for example, as illustrated in FIG. 16B, when a menu item "condition difference display" is selected, a selection of two nodes to be compared is received. For example, as illustrated in FIG. 16C, when nodes 61 and 62 are selected, the information processing apparatus 100 displays a comparison result screen that displays a comparison result of the bus wiring conditions for the selected nodes 61 and 62.

FIG. 17 is a view illustrating an example of a comparison result between two nodes. As illustrated in FIG. 17, a comparison result screen 63 displays the comparison results of the bus wiring conditions, for example, in the order of priority of the wiring condition registration items, for the two nodes selected on the node display screen 60. In the table of the comparison result screen 63, a shaded row represents an item. For example, in a node ID "XXXX" of the comparison result screen 63, "BUS1" is "L3", "BUS2" is "L5" and "BUS3" is "L7" for "bus division wiring layer". In the meantime, in a node ID "YYYY", "BUS1" is "L5", "BUS2" is "L7", and "BUS3" is "L3" for the "bus division wiring layer". In this way, the comparison result screen 63 displays differences between the two nodes. In the comparison result screen 63, when there is no difference between the two nodes, only an item row such as "net wiring width" is displayed.

Figure 18:
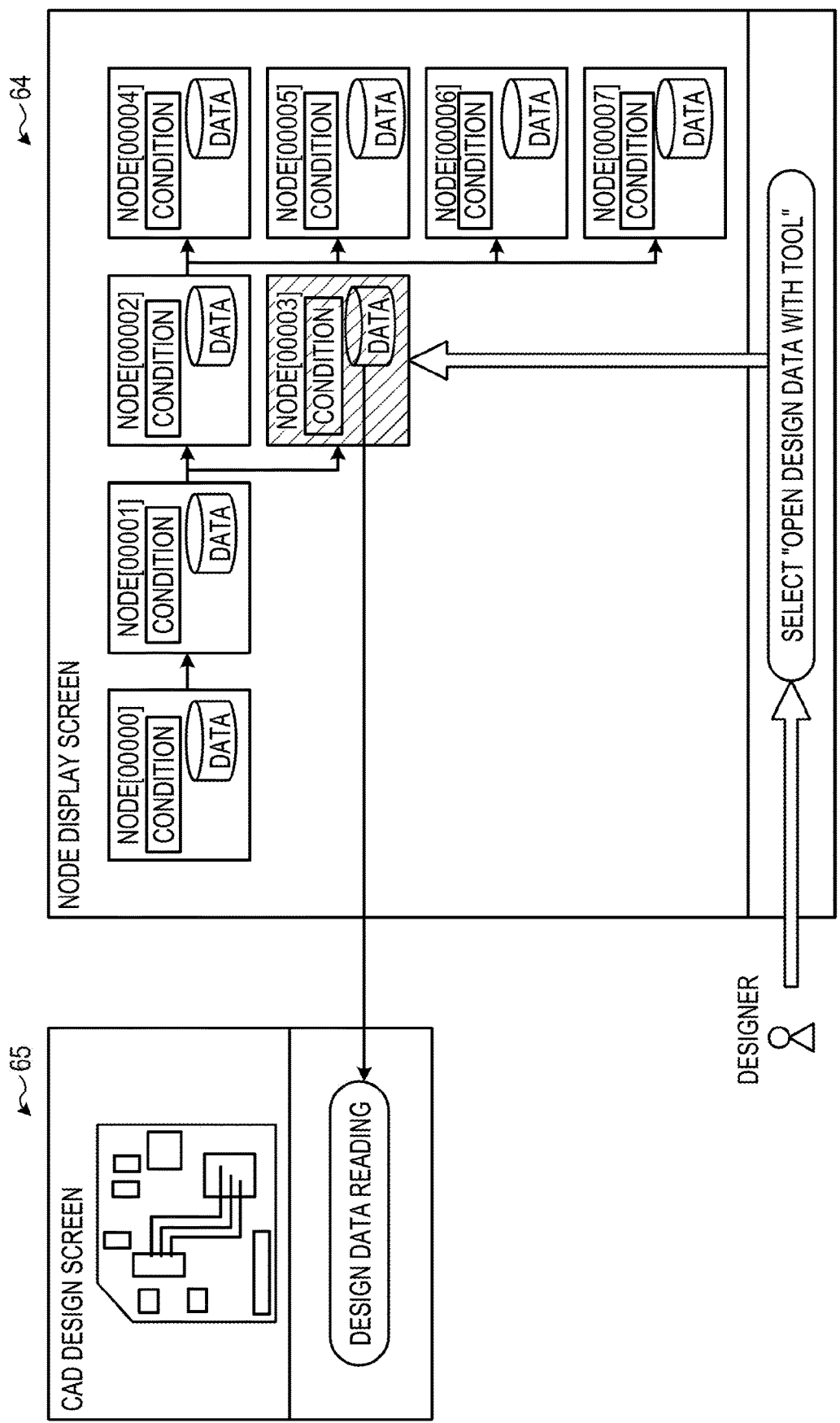
FIG. 18 is a view illustrating an example of a case where designation of a node is received.

FIG. 18 is a view illustrating an example of a case where a node designation is received. As illustrated in FIG. 18, the information processing apparatus 100 receives, for example, a selection of a node [00003] on a node display screen 64. Next, when the information processing apparatus 100 receives a selection of "open design data with tool" of the menu item, the output controller 133 transfers the design data corresponding to the node [00003] to the CAD 101. The CAD 101 reads the design data transferred from the output controller 133 and displays the read design data on a CAD design screen 65 so that it is editable by the designer. As a result, the designer may immediately resume the trial from the design data corresponding to the designated node.

Figure 19:
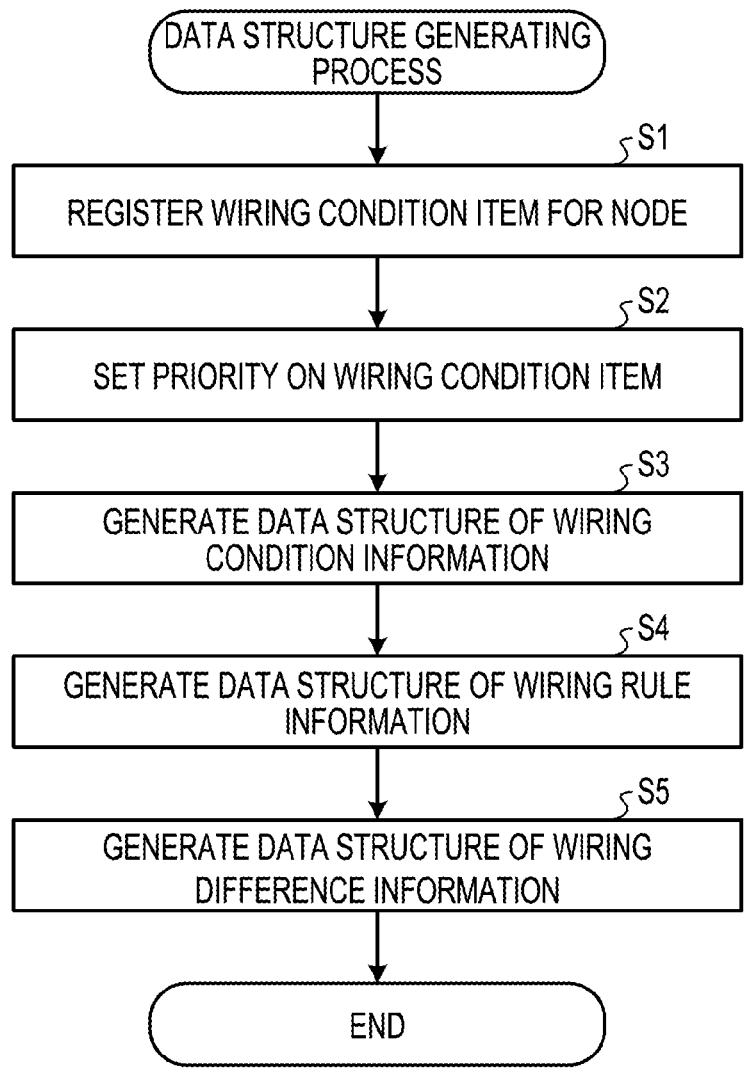
FIG. 19 is a flowchart illustrating an example of a data structure generating process according to an embodiment.

Next, the operation of the information processing apparatus 100 of the embodiment will be described. First, a data structure generating process in the node generating process will be described. FIG. 19 is a flowchart illustrating an example of a data structure generating process of the embodiment.

The generation unit 131 registers a wiring condition item for a node based on an input from the designer (step S1). The generation unit 131 stores the registered wiring condition item in the wiring condition item definition 121c of the common information storage unit 121.

The generation unit 131 receives, from the designer, the setting of the priority for the wiring condition item stored in the wiring condition item definition 121c. The generation unit 131 stores and sets the received priority setting in the wiring condition registration definition 121d of the common information storage unit 121 (step S2).

The generation unit 131 generates the node basic information 122A1 based on the design data. The generation unit 131 generates the child node management information 122A2 linked from the node basic information 122A1.

The generation unit 131 extracts data corresponding to the wiring condition registration item from the design data based on the design data and the wiring condition registration item. The generation unit 131 generates the wiring condition information 122C1, which is the data structure of the wiring condition information, and the subordinate bus definitions 122C2 to bus automatic wiring order definition 122C5 from the extracted data (step S3).

The generation unit 131 generates the wiring rule information 122D1, which is the data structure of the wiring rule information, and the subordinate net line width definition 122D2 from the extracted data (step S4). The generation unit 131 generates the wiring difference information 122E1, which is the data structure of the wiring difference information, and the subordinate wiring information 122E2 from the extracted data (step S5). As a result, the generation unit 131 may generate the data structure of a node corresponding to the design data. At the time of the second storage or thereafter, the generation unit 131 may generate the data structure of a node corresponding to the design data at the time of storage by executing steps S3 to S5.

Figure 20:
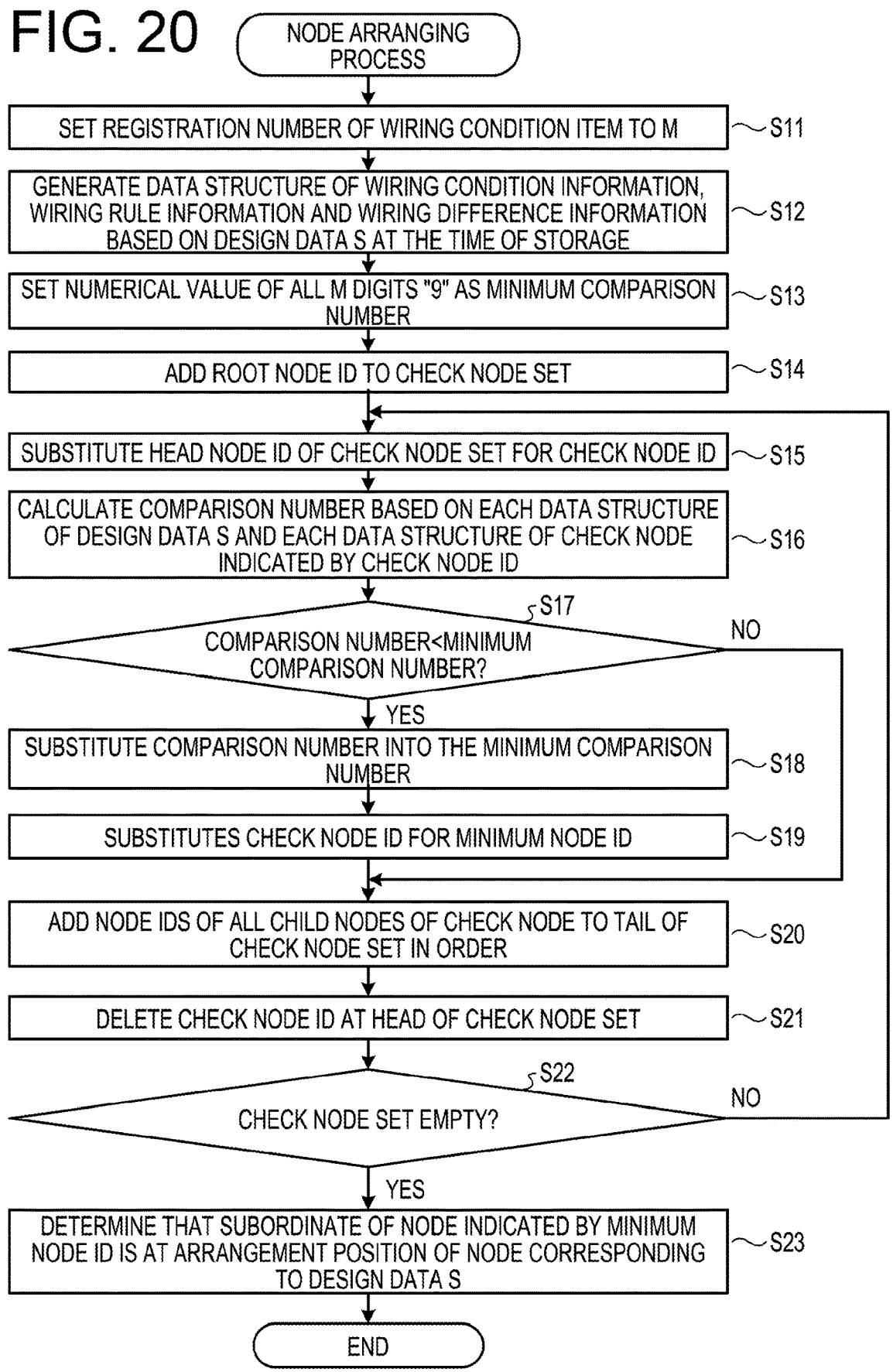
FIG. 20 is a flowchart illustrating an example of a node arranging process according to an embodiment.

Next, a node arranging process in the node generating process will be described. FIG. 20 is a flowchart illustrating an example of a node arranging process of the embodiment.

The generation unit 131 refers to the common information storage unit 121 to set the registration number of the wiring condition item to M (step S11). When the design data at the time of storage is design data S, the generation unit 131 generates the data structure of the wiring condition information, the wiring rule information, and the wiring difference information based on the design data S (step S12). That is, the generation unit 131 executes steps S3 to S5 of the data structure generating process on the design data S.

Based on the setting value M, the generation unit 131 sets the numerical value of all M digits "9" as the minimum comparison number (step S13). The generation unit 131 adds the root node ID to the check node set (step S14). The generation unit 131 substitutes the head node ID of the check node set for the check node ID (step S15). The generation unit 131 calculates a comparison number based on each data structure of the design data S and each data structure of the check node indicated by the check node ID (step S16).

The generation unit 131 determines whether the calculated comparison number is less than the minimum comparison number (step S17). When it is determined that the comparison number is less than the minimum comparison number ("Yes" in step S17), the generation unit 131 substitutes the comparison number for the minimum comparison number (step S18). In addition, the generation unit 131 substitutes the check node ID for the minimum node ID (step S19) and proceeds to step S20.

In the meantime, when it is determined that the comparison number is not less than the minimum comparison number ("No" in step S17), the generation unit 131 proceeds to step S20 without substituting the comparison number for the minimum comparison number and the check node ID for the minimum node ID.

The generation unit 131 adds the node IDs of all the child nodes of the check node to the tail of the check node set in order (step S20). Upon adding the node IDs of the child nodes to the check node set, the generation unit 131 deletes the check node ID at the head of the check node set (step S21). The generation unit 131 determines whether the check node set is empty (step S22). When it is determined that the check node set is not empty ("No" in step S22), the generation unit 131 returns to step S15 to determine the comparison number of the next check node.

When it is determined that the check node set is empty ("Yes" in step S22), the generation unit 131 determines the subordinate of the node indicated by the minimum node ID is at the arrangement position of the node corresponding to the design data S (step S23). The generation unit 131 stores the node basic information 122A1 corresponding to the design data S and the subordinate information in the node information storage unit 122, based on the determined arrangement position of the node. As a result, the information processing apparatus 100 may save the bus wiring conditions and the design data in association with the nodes of the tree structure.

Figure 21:
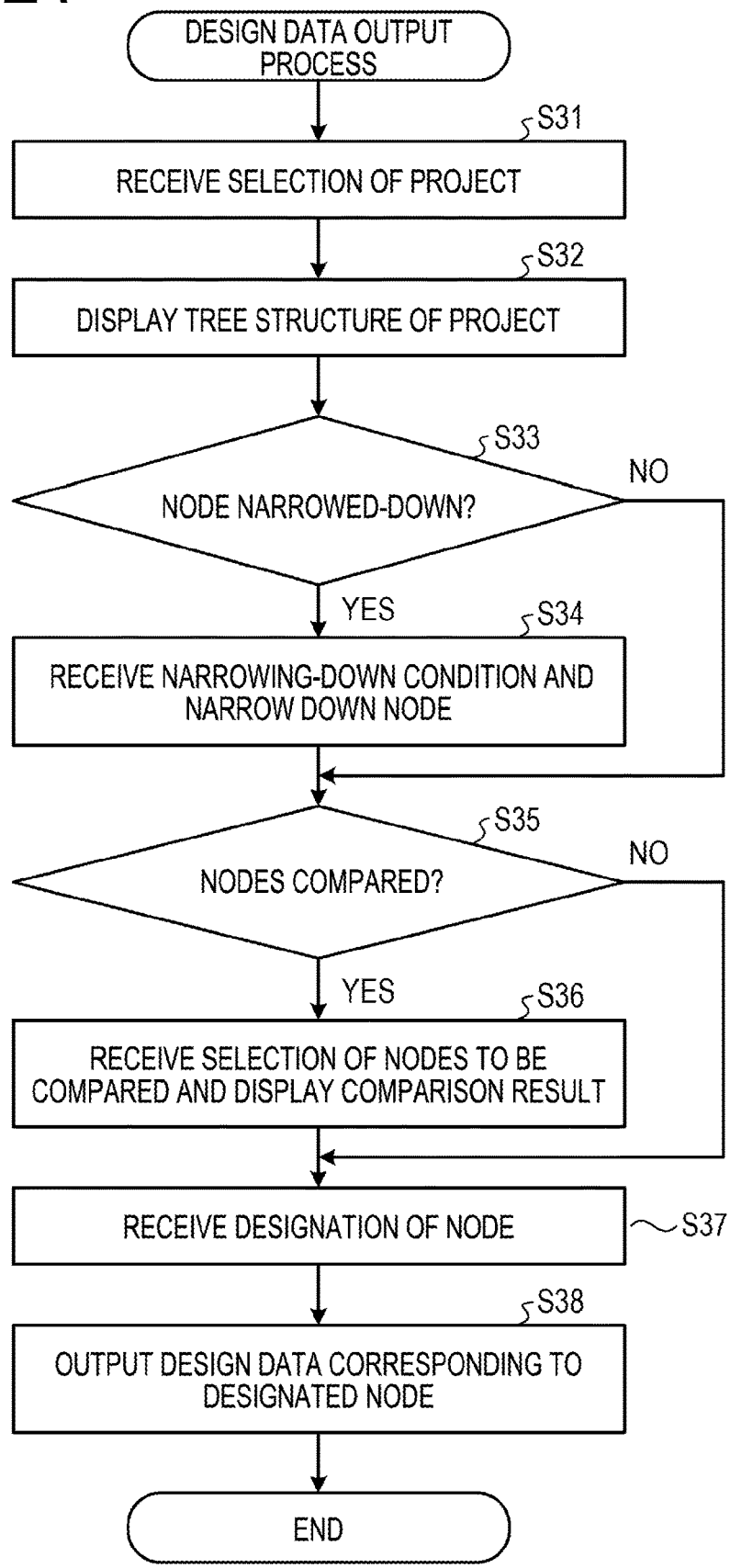
FIG. 21 is a flowchart illustrating an example of a design data outputting process according to an embodiment.

Next, a design data output process of outputting design data to be read to the CAD 101 will be described. FIG. 21 is a flowchart illustrating an example of a design data output process of the embodiment.

The search unit 132 receives a selection of a project from the designer (step S31). Upon receiving the selection of the project, the search unit 132 refers to the common information storage unit 121 and the node information storage unit 122, and displays a node display screen that displays the tree structure of the project on the display unit 111 (step S32).

The search unit 132 determines whether to narrow down a node (step S33). When it is determined that the node is to be narrowed down ("Yes" in step S33), the search unit 132 receives the narrowing-down condition, displays a node display screen with the narrowed-down node (step S34), and proceeds to step S35. When it is determined that the node is not to be narrowed down ("No" in step S33), the search unit 132 continues to display the node display screen which is being displayed, and proceeds to step S35.

The search unit 132 determines whether to compare two nodes (step S35). When it is determined that the nodes are to be compared ("Yes" in step S35), the search unit 132 receives a selection of the nodes to be compared, displays the comparison result (step S36), and proceeds to step S37. When it is determined that the nodes are not to be compared ("No" in step S35), the search unit 132 continues to display the node display screen which is being displayed, and proceeds to step S37.

The search unit 132 receives a designation of a node (step S37). The search unit 132 refers to the node information storage unit 122 and outputs the design data corresponding to the designated node to the output controller 133 (step S38). Upon receiving the design data from the search unit 132, the output controller 133 transfers the design data to the CAD 101. The CAD 101 reads the design data transferred from the output controller 133 and displays the read design data on the CAD design screen in an editable manner. Thus, the information processing apparatus 100 may obtain design data at an arbitrary stage.

In this manner, the information processing apparatus 100 generates a first node when changing the conditions of bus wiring or generating a result of the wiring based on the bus wiring conditions. The information processing apparatus 100 associates the bus wiring conditions and the design data of the changed bus wiring conditions with the generated first node, or associates the bus wiring conditions, the wiring result, and the design data of the generated wiring result with the generated first node, and stores the association in the storage unit 120. Upon receiving a designation of the bus wiring conditions, the information processing apparatus 100 searches for a second node that matches the designated bus wiring conditions. The information processing apparatus 100 outputs the design data corresponding to the searched second node. As a result, the information processing apparatus 100 may obtain design data at an arbitrary stage.

In addition, the information processing apparatus 100 generates the first node to provide a tree structure having a reference node as a root node and the first node as a child node. As a result, the information processing apparatus 100 may store the history of the design data.

In addition, when generating the first node, the information processing apparatus 100 calculates a difference between the bus wiring condition corresponding to the first node and the bus wiring condition of the existing node by using the breadth-first search in order from the root node, and generates the first node under the existing node with the calculated smallest difference. As a result, the information processing apparatus 100 may arrange nodes having close bus wiring conditions in the vicinity.

Further, when the bus wiring condition has plural items, the information processing apparatus 100 gives priority to the items, calculates a value indicating the presence/absence of the difference for each item having the higher priority item as the higher order digit, and generates the first node under the existing node with the calculated smallest value. As a result, the information processing apparatus 100 may arrange nodes having close bus wiring conditions in the vicinity.

Further, the generation unit 131 compares the wiring condition information on the bus, the wiring rule information on the wiring rule on a board, and the wiring difference information on the wiring difference between the parent node and the child nodes, and calculates a difference for each item between the generated first node and the existing node.

As a result, the information processing apparatus 100 may arrange nodes having close bus wiring conditions in the vicinity.

Further, in the information processing apparatus 100, the bus wiring condition includes one or more pieces of information among the bus net definition, the bus wiring target layer, the bus route, the bus automatic wiring priority order, the net line width, and the wiring result. As a result, the information processing apparatus 100 may generate nodes corresponding to each condition in the bus wiring.

Further, the information processing apparatus 100 displays a tree structure matching the predetermined search condition and receives a designation of the bus wiring condition by receiving the designation of the node included in the displayed tree structure. As a result, the information processing apparatus 100 may output the design data corresponding to the designated node.

Further, the information processing apparatus 100 displays the tree structure and receives a designation of two nodes included in the displayed tree structure. Further, the information processing apparatus 100 displays a difference in the bus wiring condition between the two received nodes and receives a designation of the bus wiring condition by receiving a designation of one of the two nodes. As a result, the information processing apparatus 100 may receive a designation of a node based on the comparison result of the two nodes.

In the above-described embodiment, the node generating process and the design data output process are executed by the information processing apparatus 100 that also operates the CAD 101. However, the present disclosure is not limited thereto. For example, the node generating process and the design data output process may be executed on a cloud, and the CAD 101 may be executed by a terminal device of the designer. In this case, since the node information and the design data are saved on the cloud, it is possible to cope with a large amount of branches occurring in the tree structure and the increase in data amount.

Further, in the above-described embodiment, the generation of the branch nodes is not particularly limited. However, the present disclosure is not limited thereto. For example, when the wiring result becomes poor, restrictions may be added to the nodes including the specific condition so that they do not branch in the future, thereby avoiding an unnecessary work.

Further, in the above-described embodiment, the branch nodes are generated at the time of storing the design data by the designer. However, the present disclosure is not limited thereto. For example, a machine learning model may be generated based on conditions, rules, and surrounding wiring conditions for a specific bus such as a memory bus, and data of a wiring result (wiring rate) for the bus, and the generated learning model may be used to automatically generate the branch nodes. In this case, the generated branch nodes may be nodes corresponding to all of the optimum conditions of the bus to be wired and conditions under which good wiring results (e.g., the wiring rate not less than a certain rate) are assumed, thereby reducing trial and error due to a condition change.

The constituent elements of the illustrated parts are not necessarily physically configured as illustrated. In other words, the specific forms of distribution and integration of the parts are not limited to those illustrated, and all or a portion thereof may be distributed or integrated functionally or physically in arbitrary units according to various loads or usage conditions. For example, the search unit 132 and the output controller 133 may be integrated. In addition, the illustrated processes are not limited to the above-described order but may be performed simultaneously or in the changed order as long as the processing contents are not inconsistent.

The various processing functions performed by the respective devices may be entirely or partially executed on a CPU (Central Processing Unit) (or a microcomputer such as an MPU (Micro Processing Unit) or an MCU (Micro Controller Unit)). It is also needless to say that the various processing functions may be entirely or partially executed on a program analyzed and executed by a CPU (or a microcomputer such as an MPU or an MCU) or on hardware by a wired logic.

Figure 22:
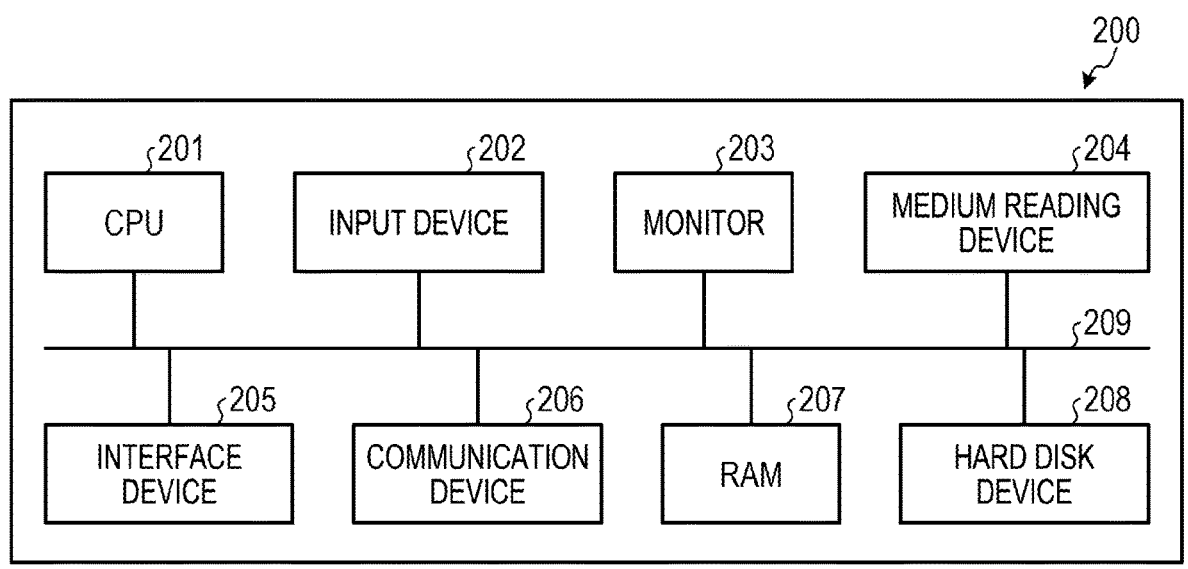
FIG. 22 is a view illustrating an example of a computer that executes a bus wiring search program.

The various processes described in the above embodiments may be implemented by executing a prepared program in a computer. Hereinafter, an example of a computer that executes a program having the same functions as the above embodiments will be described. FIG. 22 is a view illustrating an example of a computer that executes a bus wiring search program.

As illustrated in FIG. 22, the computer 200 includes a CPU 201 that executes various calculating processes, an input device 202 that receives data input, and a monitor 203. The computer 200 further includes a medium reading device 204 that reads a program from a storage medium, an interface device 205 that connects to various devices, and a communication device 206 that connects to other information processing apparatuses in a wired or wireless manner. The computer 200 further includes a RAM 207 that temporarily stores various kinds of information, and a hard disk device 208. The devices 201 to 208 are connected to a bus 209.

The hard disk device 208 stores a bus wiring search program having the same functions as the respective processing units such as the generation unit 131, the search unit 132, and the output controller 133 illustrated in FIG. 1B. In addition, the hard disk device 208 stores various data that implement the common information storage unit 121, the node information storage unit 122, and the bus wiring search program. The input device 202 receives an input of various pieces of information such as operation information from a user of the computer 200. The monitor 203 displays various screens such as a display screen for the user of the computer 200. A printer is connected to the interface device 205. The communication device 206 has the same function as that of the communication unit 110 illustrated in FIG. 1A and is connected to a network (not illustrated) to exchange various pieces of information with other information processing apparatuses and various servers.

The CPU 201 reads programs stored in the hard disk device 208 and deploys and executes the read programs on the RAM 207 for various processes. In addition, these programs may cause the computer 200 to function as the generation unit 131, the search unit 132, and the output controller 133 illustrated in FIG. 1B.

The above-described bus wiring search program is not necessarily stored in the hard disk drive 208. For example, the computer 200 may read and execute a program stored in a storage medium readable by the computer 200. The storage medium readable by the computer 200 is, for example, a portable recording medium such as a CD-ROM, a DVD (Digital Versatile Disc), or a USB (Universal Serial Bus) memory, a semiconductor memory such as a flash memory, a hard disk drive, etc. The bus wiring search program may be stored in a device connected to a public line, the Internet, or a LAN and may be read and executed by the computer 200.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. A non-transitory computer-readable recording medium having stored therein a program that causes a computer to execute a process, the process comprising:

generating a first node when a bus wiring condition is changed from a first wiring condition to a second wiring condition or when a result of bus wiring is generated based on the first wiring condition;

storing the first wiring condition and design data of bus wiring after the change of the bus wiring condition in a storage unit in association with the first node when the bus wiring condition is changed from the first wiring condition to the second wiring condition;

storing the first wiring condition, the result of bus wiring, and the design data of bus wiring after the result of bus wiring is generated in the storage unit in association with the first node when the result of bus wiring is generated based on the first wiring condition;

searching, upon receiving a designation of a bus wiring condition, for a second node that matches the designated bus wiring condition; and outputting design data of bus wiring corresponding to the second node.

2. The non-transitory computer-readable recording medium according to claim 1, the process further comprising:

generating the first node so as to provide a tree structure having a reference node as a root node and the first node as a child node.

3. The non-transitory computer-readable recording medium according to claim 2, the process further comprising:

calculating a difference between the first wiring condition and a bus wiring condition of each of existing nodes in the tree structure using a breadth-first search from the root node; and generating the first node under an existing node with a smallest difference.

4. The non-transitory computer-readable recording medium according to claim 3, the process further comprising:

giving priority to each of a plurality of items when a bus wiring condition has the plurality of items; and calculating the difference as a value indicating presence/absence of a difference in each of the plurality of items, wherein the value has a higher priority item as a higher order digit.

5. The non-transitory computer-readable recording medium according to claim 4, the process further comprising:

comparing wiring condition information on a bus, wiring rule information on a wiring rule on a board, and wiring difference information on a wiring difference between a parent node and child nodes; and calculating a difference for each item between the first node and each of the existing nodes.

6. The non-transitory computer-readable recording medium according to claim 3, wherein the bus wiring condition includes one or more pieces of information among a bus net definition, a bus wiring target layer, a bus route, a bus automatic wiring priority order, a net line width, and the result of bus wiring.

7. The non-transitory computer-readable recording medium according to claim 2, the process further comprising:
   displaying a tree structure that matches a predetermined search condition; and
   receiving the designation of a bus wiring condition by receiving a designation of a node included in the displayed tree structure.

8. The non-transitory computer-readable recording medium according to claim 2, the process further comprising:
   displaying the tree structure;
   receiving a designation of two nodes included in the tree structure;
   displaying a difference in a bus wiring condition between the two nodes; and
   receiving the designation of a bus wiring condition by receiving a designation of one of the two nodes.

9. A bus wiring searching method, comprising:
   generating, by a computer, a first node when a bus wiring condition is changed from a first wiring condition to a second wiring condition or when a result of bus wiring is generated based on the first wiring condition;
   storing the first wiring condition and design data of bus wiring after the change of the bus wiring condition in a storage unit in association with the first node when the bus wiring condition is changed from the first wiring condition to the second wiring condition;
   storing the first wiring condition, the result of bus wiring, and the design data of bus wiring after the result of bus wiring is generated in the storage unit in association with the first node when the result of bus wiring is generated based on the first wiring condition;
   searching, upon receiving a designation of a bus wiring condition, for a second node that matches the designated bus wiring condition; and
   outputting design data of bus wiring corresponding to the second node.

10. An information processing apparatus, comprising:
    a memory; and
    a processor coupled to the memory and the processor configured to:
    generate a first node when a bus wiring condition is changed from a first wiring condition to a second wiring condition or when a result of bus wiring is generated based on the first wiring condition;
    store the first wiring condition and design data of bus wiring after the change of the bus wiring condition in a storage unit in association with the first node when the bus wiring condition is changed from the first wiring condition to the second wiring condition;
    store the first wiring condition, the result of bus wiring, and the design data of bus wiring after the result of bus wiring is generated in the storage unit in association with the first node when the result of bus wiring is generated based on the first wiring condition;
    search, upon receiving a designation of a bus wiring condition, for a second node that matches the designated bus wiring condition; and
    output design data of bus wiring corresponding to the second node.

* * * * *